United States Patent
Kutz et al.

(10) Patent No.: US 12,184,425 B2
(45) Date of Patent: Dec. 31, 2024

(54) LOSSY COMPRESSED FEEDBACK FOR MULTIPLE INCREMENTAL REDUNDANCY SCHEME (MIRS)

(71) Applicant: QUALCOMM Incorporated, San Diego, CA (US)

(72) Inventors: Gideon Shlomo Kutz, Ramat Hasharon (IL); Tal Oved, Modiin (IL); Assaf Touboul, Netanya (IL)

(73) Assignee: QUALCOMM Incorporated, San Diego, CA (US)

( * ) Notice: Subject to any disclaimer, the term of this patent is extended or adjusted under 35 U.S.C. 154(b) by 24 days.

(21) Appl. No.: 17/480,823

(22) Filed: Sep. 21, 2021

(65) Prior Publication Data

US 2023/0090440 A1 Mar. 23, 2023

(51) Int. Cl.
| | |
|---|---|
| *H04L 1/18* | (2023.01) |
| *H03M 7/30* | (2006.01) |
| *H04L 1/00* | (2006.01) |
| *H04L 1/1812* | (2023.01) |
| *H04L 5/00* | (2006.01) |

(52) U.S. Cl.
CPC ........ *H04L 1/1819* (2013.01); *H03M 7/3059* (2013.01); *H04L 1/0073* (2013.01); *H04L 1/0081* (2013.01); *H04L 5/0055* (2013.01)

(58) Field of Classification Search
None
See application file for complete search history.

(56) References Cited

U.S. PATENT DOCUMENTS

| | | | | |
|---|---|---|---|---|
| 9,928,845 | B2* | 3/2018 | Fischer | G10L 19/24 |
| 11,006,133 | B2* | 5/2021 | Keinert | H04N 19/94 |
| 11,122,300 | B2* | 9/2021 | Helmrich | H04N 19/46 |
| 2017/0237530 | A1* | 8/2017 | Wesel | H04L 1/22 375/295 |
| 2019/0028723 | A1* | 1/2019 | Swaminathan | H04N 19/94 |
| 2019/0110063 | A1* | 4/2019 | Mukherjee | H04N 19/517 |

(Continued)

FOREIGN PATENT DOCUMENTS

WO WO-2021038001 A1 * 3/2021 ........... H04L 1/1607

OTHER PUBLICATIONS

Partial International Search Report—PCT/US2022/040901—ISA/EPO—Nov. 11, 2022.

(Continued)

*Primary Examiner* — Mujtaba M Chaudry
(74) *Attorney, Agent, or Firm* — Dinsmore & Shohl LLP—Qualcomm

(57) ABSTRACT

Various embodiments may provide systems and methods for supporting lossy compression of feedback information, such as acknowledgment (ACK) information, negative acknowledgement (NACK) information, etc. Various embodiments may support lossy compression for feedback messages in retransmission systems, such as Hybrid Automatic Repeat Request (HARD) protocols, the Multiple Incremental Redundancy Scheme (MIRS), etc. Various embodiments may support compression of feedback bits using a different compression codebook per symbol or per group of symbols. Various embodiments may support selection of a compression codebook per symbol, or per group of symbols, based at least in part on a probability of successful decoding of each code block in the symbol or group of symbols.

26 Claims, 13 Drawing Sheets

(56) References Cited

U.S. PATENT DOCUMENTS

2019/0165893 A1* 5/2019 Khosravirad ..... H03M 13/6306
2020/0186809 A1* 6/2020 Mukherjee ........... H04N 19/176
2020/0329233 A1* 10/2020 Nemirofsky ......... H04N 19/136

OTHER PUBLICATIONS

International Search Report and Written Opinion—PCT/US2022/040901—ISA/EPO—Jan. 9, 2023 16 pages.

* cited by examiner

| Non-compressed message $p_0 p_1 p_2$ | Message Probability Where $p_0 = p_1 = 0.3$ and $p_2 = 0.7$ | Codebook | | | | | | | |
|---|---|---|---|---|---|---|---|---|---|
| | | A<br>K=8 | B<br>K=7 | C<br>K=6 | D<br>K=5 | E<br>K=4 | F<br>K=3 | G<br>K=2 |
| 000 | 0.063 | 000 | 000 | 000 | 100 | 100 | 100 | 110 |
| 001 | 0.027 | 001 | 101 | 101 | 101 | 111 | 111 | 111 |
| 010 | 0.147 | 010 | 010 | 010 | 010 | 010 | 110 | 110 |
| 011 | 0.063 | 011 | 011 | 111 | 111 | 111 | 111 | 111 |
| 100 | 0.147 | 100 | 100 | 100 | 100 | 100 | 100 | 110 |
| 101 | 0.063 | 101 | 101 | 101 | 101 | 111 | 111 | 111 |
| 110 | 0.343 | 110 | 110 | 110 | 110 | 110 | 110 | 110 |
| 111 | 0.147 | 111 | 111 | 111 | 111 | 111 | 111 | 111 |
| Rate Distortion Measure "D" | | 0 | 0.027 | 0.09 | 0.153 | 0.243 | 0.39 | 0.6 |

One excess Re-Tx
Two excess Re-Tx

LOSSY COMPRESSED FEEDBACK FOR MULTIPLE INCREMENTAL REDUNDANCY SCHEME (MIRS)

BACKGROUND

Long Term Evolution (LTE), 5G new radio (NR) (5GNR), and other recently developed communication technologies allow wireless devices to communicate information at data rates (e.g., in terms of Gigabits per second, etc.) that are orders of magnitude greater than what was available just a few years ago.

Today's communication networks are also more secure, resilient to multipath fading, allow for lower network traffic latencies, provide better communication efficiencies (e.g., in terms of bits per second per unit of bandwidth used, etc.). These and other recent improvements have facilitated the emergence of the Internet of Things (JOT), large scale Machine to Machine (M2M) communication systems, autonomous vehicles, and other technologies that rely on consistent and secure communications.

SUMMARY

Various aspects include systems and methods for supporting lossy compression of feedback information, such as acknowledgment (ACK) information, negative acknowledgement (NACK) information, etc. Various aspects may support lossy compression for feedback messages in retransmission systems, such as Hybrid Automatic Repeat Request (HARD) protocols, the Multiple Incremental Redundancy Scheme (MIRS), etc. Various aspects may support compression of feedback bits using a different compression codebook per feedback group, such as per portion of a symbol, per symbol, or per group of symbols. Various aspects may support selection of a compression codebook per feedback group, such as per portion of a symbol, per symbol, or per group of symbols, based at least in part on a probability of successful decoding of each code block in the feedback group. Various aspects may include methods for supporting lossy compression feedback in wireless communication retransmissions.

Various aspects may include determining first decoding results for a number of code blocks in a first feedback group received from a sending device, selecting a first compression codebook for use in generating a feedback message for the first decoding results based at least in part on a probability of successful decoding of each code block in the first feedback group, generating a first feedback message for the first decoding results using the selected first compression codebook, and sending the first feedback message to the sending device.

Some aspects may further include determining second decoding results for a number of code blocks in a second feedback group received from the sending device, selecting a second compression codebook for use in generating a feedback message for the second decoding results based at least in part on a probability of successful decoding of each code block in the second feedback group, generating a second feedback message for the second decoding results using the selected second compression codebook, and sending the second feedback message to the sending device. In some aspects, the first feedback group may be a first symbol received from the sending device and the second feedback group may be a second symbol received from the sending device.

Some aspects may further include determining a retransmission cycle number for each code block in the first feedback group and determining the probability of successful decoding of each code block in the first feedback group based at least in part on each code block's determined retransmission cycle number. In some aspects, determining the probability of successful decoding of each code block in the first feedback group based at least in part on each code block's determined retransmission cycle number may include determining the probability of successful decoding of each code block in the first feedback group as a probability value correlated with that code block's retransmission cycle number in a pre-defined mapping of retransmission cycle numbers to probability values. Some aspects may further include receiving from the sending device an indication of a number of code blocks to feedback, an indication of a number of waveforms to be used for feedback, and the pre-defined mapping of retransmission cycle numbers to probability values, and selecting the first compression codebook for use in generating the feedback message for the first decoding results based at least in part on the probability of successful decoding of each code block in the first feedback group may include selecting the first compression codebook for use in generating the feedback message for the first decoding results based at least in part on the probability of successful decoding of each code block in the first feedback group, the number of code blocks to feedback, and the number of waveforms to be used for feedback. Some aspects may further include receiving an indication of an update to the pre-defined mapping of retransmission cycle numbers to probability values from the sending device. Some aspects may further include observing a condition of the wireless communication and updating probability values of the pre-defined mapping of retransmission cycle numbers to probability values based at least in part on an adaptation rule associated with the observed condition of the wireless communication.

In some aspects, the first compression codebook may be selected from a group of allowed codebooks indicated by the sending device.

In some aspects, the first compression codebook may be signaled to the receiving device by the sending device.

Some aspects may further include determining a gap-to-capacity number of units for a next retransmission and inserting an indication of the gap-to-capacity number of units for the next retransmission in the first feedback message.

In some aspects, the first feedback message may include a feedback rank indication.

Various aspects may include generating a mapping of retransmission cycle numbers to probability values and sending the mapping of retransmission cycle numbers to probability values a receiving device. In some aspects, the probability values may be based at least in part on a number of retransmission cycles for a code block. In some aspects, the probability values may be further based at least in part on one or more of an existence of frequency spurs, a proximity of a demodulated reference signal (DMRS), a current estimated signal-to-noise ratio (SNR), and a current number of Multiple Input Multiple Output (MIMO).

Some aspects may further include determining a number of code blocks to feedback, sending an indication of the number of code blocks to feedback to the receiving device, determining a number of waveforms to be used for feedback, and sending an indication of the number of waveforms to be used for feedback to the receiving device.

Some aspects may further include determining an update to the mapping of retransmission cycle numbers to probability values and sending an indication of the update to the mapping of retransmission cycle numbers to probability values to the receiving device.

Some aspects may further include determining a group of allowed codebooks for a receiving device and sending an indication of the group of allowed codebooks to the receiving device.

Some aspects may further include receiving a feedback message from the receiving device including an indication of a gap-to-capacity number of units for a next retransmission, adjusting a retransmission modulation and coding scheme for a next retransmission by the gap-to-capacity number of units, and sending the next retransmission to the receiving device.

Further aspects may include a wireless device having a processor configured to perform one or more operations of any of the methods summarized above. Further aspects may include processing devices for use in a wireless device configured with processor-executable instructions to perform operations of any of the methods summarized above. Further aspects may include a non-transitory processor-readable storage medium having stored thereon processor-executable instructions configured to cause a processor of a wireless device to perform operations of any of the methods summarized above. Further aspects include a wireless device having means for performing functions of any of the methods summarized above. Further aspects include a system on chip for use in a wireless device and that includes a processor configured to perform one or more operations of any of the methods summarized above.

Further aspects may include a base station having a processor configured to perform one or more operations of any of the methods summarized above. Further aspects may include processing devices for use in a base station configured with processor-executable instructions to perform operations of any of the methods summarized above. Further aspects may include a non-transitory processor-readable storage medium having stored thereon processor-executable instructions configured to cause a processor of a base station to perform operations of any of the methods summarized above. Further aspects include a base station having means for performing functions of any of the methods summarized above. Further aspects include a system on chip for use in a base station and that includes a processor configured to perform one or more operations of any of the methods summarized above.

BRIEF DESCRIPTION OF THE DRAWINGS

The accompanying drawings, which are incorporated herein and constitute part of this specification, illustrate exemplary embodiments of the claims, and together with the general description given above and the detailed description given below, serve to explain the features of the claims.

DETAILED DESCRIPTION

Figure 1:
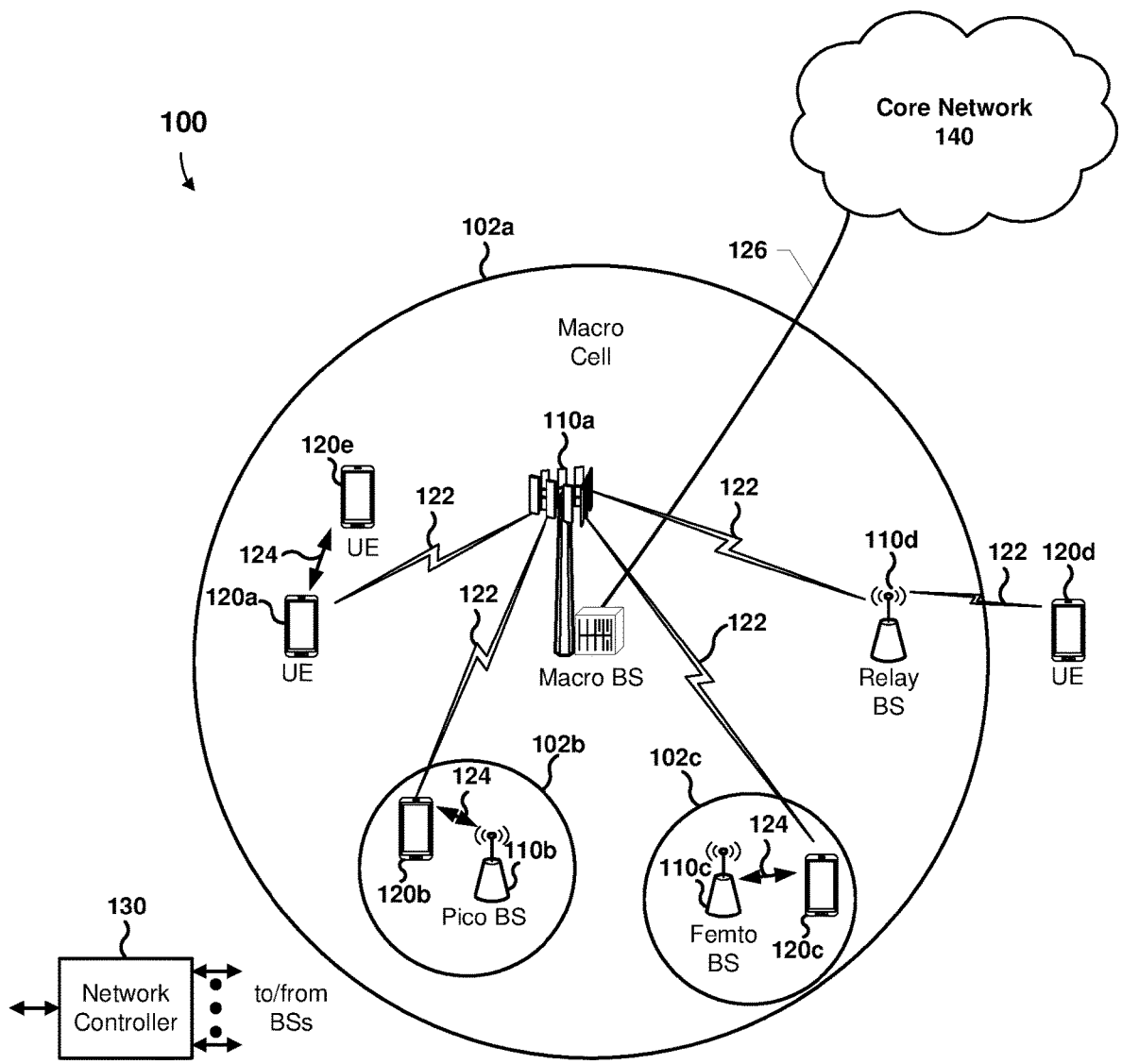
FIG. 1 is a system block diagram illustrating an example communications system suitable for implementing various embodiments.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include systems and methods for supporting lossy compression of feedback information, such as an acknowledgment (ACK) messages and/or or negative acknowledgment (NACK) messages. Various embodiments may support lossy compression for feedback messages in retransmission systems, such as Hybrid Automatic Repeat Request (HARQ) protocols, the Multiple Incremental Redundancy Scheme (MIRS), etc. Various embodiments may enable reducing the number of bits required to send feedback information (referred to herein as "feedback bits"), thereby reducing the bandwidth required to transmit feedback information and reducing the impact on wireless communication system performance in implementing retransmissions. Some embodiments may support compression of feedback bits using a different compression codebook per feedback group, such as per portion of a symbol, per symbol, or per group of symbols. Some embodiments may support selection of a compression codebook per feedback group, such as per portion of a symbol, per symbol, or per group of symbols, based at least in part on a probability of successful decoding of each code block in the symbol or group of symbols. The selection of a compression codebook based at least in part on probability of successful decoding of code blocks may enable a compression of feedback bits to be adjusted on a per feedback group, such as per portion of a symbol, per symbol, or per group of symbols, basis in response to dynamic changing transmission characteristics, such as changes in effective coding rates, changes in signal characteristics, etc.

The term "wireless device" is used herein to refer to any one or all of wireless router devices, wireless appliances, cellular telephones, smartphones, portable computing devices, personal or mobile multi-media players, laptop computers, tablet computers, smartbooks, ultrabooks, palm-top computers, wireless electronic mail receivers, multimedia Internet-enabled cellular telephones, medical devices and equipment, biometric sensors/devices, wearable devices including smart watches, smart clothing, smart glasses, smart wrist bands, smart jewelry (for example, smart rings and smart bracelets), entertainment devices (for example, wireless gaming controllers, music and video players, satellite radios, etc.), wireless-network enabled Internet of Things (IoT) devices including smart meters/sensors, industrial manufacturing equipment, large and small machinery and appliances for home or enterprise use, wireless communication elements within autonomous and semiautonomous vehicles, wireless devices affixed to or incorporated into various mobile platforms, global positioning system devices, and similar electronic devices that include a memory, wireless communication components and a programmable processor.

The term "sending device" is used herein to refer to a wireless device that is sending messages and/or information to a receiving wireless device according to various embodiments. Similarly, the term "receiving device" is used herein to refer to a wireless device that is receiving messages and/or information from a sending wireless device according to various embodiments.

The term "system on chip" (SOC) is used herein to refer to a single integrated circuit (IC) chip that contains multiple resources or processors integrated on a single substrate. A single SOC may contain circuitry for digital, analog, mixed-signal, and radio-frequency functions. A single SOC also may include any number of general purpose or specialized processors (digital signal processors, modem processors, video processors, etc.), memory blocks (such as ROM, RAM, Flash, etc.), and resources (such as timers, voltage regulators, oscillators, etc.). SOCs also may include software for controlling the integrated resources and processors, as well as for controlling peripheral devices.

The term "system in a package" (SIP) may be used herein to refer to a single module or package that contains multiple resources, computational units, cores or processors on two or more IC chips, substrates, or SOCs. For example, a SIP may include a single substrate on which multiple IC chips or semiconductor dies are stacked in a vertical configuration. Similarly, the SIP may include one or more multi-chip modules (MCMs) on which multiple ICs or semiconductor dies are packaged into a unifying substrate. A SIP also may include multiple independent SOCs coupled together via high speed communication circuitry and packaged in close proximity, such as on a single motherboard or in a single wireless device. The proximity of the SOCs facilitates high speed communications and the sharing of memory and resources.

As used herein, the terms "network," "system," "wireless network," "cellular network," and "wireless communication network" may interchangeably refer to a portion or all of a wireless network of a carrier associated with a wireless device and/or subscription on a wireless device. The techniques described herein may be used for various wireless communication networks, such as Code Division Multiple Access (CDMA), time division multiple access (TDMA), FDMA, orthogonal FDMA (OFDMA), single carrier FDMA (SC-FDMA) and other networks. In general, any number of wireless networks may be deployed in a given geographic area. Each wireless network may support at least one radio access technology, which may operate on one or more frequency or range of frequencies. For example, a CDMA network may implement Universal Terrestrial Radio Access (UTRA) (including Wideband Code Division Multiple Access (WCDMA) standards), CDMA2000 (including IS-2000, IS-95 and/or IS-856 standards), etc. In another example, a TDMA network may implement GSM Enhanced Data rates for GSM Evolution (EDGE). In another example, an OFDMA network may implement Evolved UTRA (E-UTRA) (including LTE standards), IEEE 802.11 (WiFi), IEEE 802.16 (WiMAX), IEEE 802.20, Flash-OFDM®, etc. Reference may be made to wireless networks that use LTE standards, and therefore the terms "Evolved Universal Terrestrial Radio Access," "E-UTRAN" and "eNodeB" may also be used interchangeably herein to refer to a wireless network. However, such references are provided merely as examples, and are not intended to exclude wireless networks that use other communication standards. For example, while various Third Generation (3G) systems, Fourth Generation (4G) systems, and Fifth Generation (5G) systems are discussed herein, those systems are referenced merely as examples and future generation systems (e.g., sixth generation (6G) or higher systems) may be substituted in various examples.

As used herein, the term "RF chain" refers to the components in a communication device that send, receive, and decode radio frequency signals. An RF chain typically includes a number of components coupled together that transmit RF signals that are referred to as a "transmit chain," and a number of components coupled together that receive and process RF signals that are referred to as a "receive chain."

The terms "network operator," "operator," "mobile network operator," "carrier," and "service provider" are used interchangeably herein to describe a provider of wireless communications services that owns or controls elements to sell and deliver communication services to an end user, and provides necessary provisioning and credentials as policies implemented in user device subscriptions.

LTE is a mobile network standard for 4G wireless communication of high-speed data developed by the 3GPP (3rd Generation Partnership Project) and specified in its Release 8 document series. The 5G system (5GS) is an advanced technology from 4G LTE, and provides a new radio access technology (RAT) through the evolution of the existing mobile communication network structure. Implementations for 5GS networks are currently being adopted that provide new radio (NR) (also referred to as 5G) support via NR base stations, such as Next Generation NodeB (gNodeBs or gNBs)). The 5G systems and NR base stations are providing flexibility in bandwidth scheduling and utilization. Future generation systems (e.g., sixth generation (6G) or higher systems) may provide the same or similar flexibility in bandwidth scheduling and utilization.

In LTE and/or 5G (or later generation) systems network devices, such as base stations, may broadcast packets to wireless devices in a cell. For ease of reference, the term "network device" or "network computing device" is used to refer to any of a variety of network elements that may perform operations of various embodiments, non-limiting examples of which include a base station, an eNodeB, a gNodeB, an Applicant Function (AF) server, User Plane Function (UPF) server, Operations, Policy Charging Function (PCF) server, content server, application server, etc.

FIG. 1 illustrates an example of a communications system 100 that is suitable for implementing various embodiments. The communications system 100 may be a 5G New Radio (NR) (5GNR) network, or any other suitable network such as a Long Term Evolution (LTE) network. While FIG. 1 illustrates a 5GNR network, later generation networks may include the same or similar elements. Therefore, the reference to a 5GNR network and 5GNR network elements in the following descriptions is for illustrative purposes and is not intended to be limiting.

The communications system 100 may include a heterogeneous network architecture that includes a core network 140 and a variety of mobile devices (also referred to as user equipment (UE) computing devices) (illustrated as wireless device 120a-120e in FIG. 1). The communications system 100 may also include a number of base stations (illustrated as the BS 110a, the BS 110b, the BS 110c, and the BS 110d) and other network entities. A base station is an entity that communicates with wireless devices (mobile devices or UE computing devices), and also may be referred to as an NodeB, a Node B, an LTE evolved nodeB (eNB), an Access point (AP), a radio head, a transmit receive point (TRP), a New Radio base station (NR BS), a 5G NodeB (NB), a Next Generation NodeB (gNB), or the like. Each base station may provide communication coverage for a particular geographic area. In 3GPP, the term "cell" can refer to a coverage area of a base station, a base station subsystem serving this coverage area, or a combination thereof, depending on the context in which the term is used.

A base station 110a-110d may provide communication coverage for a macro cell, a pico cell, a femto cell, another type of cell, or a combination thereof. A macro cell may cover a relatively large geographic area (for example, several kilometers in radius) and may allow unrestricted Access by mobile devices with service subscription. A pico cell may cover a relatively small geographic area and may allow unrestricted Access by mobile devices with service subscription. A femto cell may cover a relatively small geographic area (for example, a home) and may allow restricted Access by mobile devices having association with the femto cell (for example, mobile devices in a closed subscriber group (CSG)). A base station for a macro cell may be referred to as a macro BS. A base station for a pico cell may be referred to as a pico BS. A base station for a femto cell may be referred to as a femto BS or a home BS. In the example illustrated in FIG. 1, a base station 110a may be a macro BS for a macro cell 102a, a base station 110b may be a pico BS for a pico cell 102b, and a base station 110c may be a femto BS for a femto cell 102c. A base station 110a-110d may support one or multiple (for example, three) cells. The terms "eNB", "base station", "NR BS", "gNB", "TRP", "AP", "node B", "5G NB", and "cell" may be used interchangeably herein.

In some examples, a cell may not be stationary, and the geographic area of the cell may move according to the location of a mobile base station. In some examples, the base stations 110a-110d may be interconnected to one another as well as to one or more other base stations or network nodes (not illustrated) in the communications system 100 through various types of backhaul interfaces, such as a direct physical connection, a virtual network, or a combination thereof using any suitable transport network.

The base station 110a-110d may communicate with the core network 140 over a wired or wireless communication link 126. The wireless device 120a-120e (UE computing device) may communicate with the base station 110a-110d over a wireless communication link 122.

The wired communication link 126 may use a variety of wired networks (e.g., Ethernet, TV cable, telephony, fiber optic and other forms of physical network connections) that may use one or more wired communication protocols, such as Ethernet, Point-To-Point protocol, High-Level Data Link Control (HDLC), Advanced Data Communication Control Protocol (ADCCP), and Transmission Control Protocol/Internet Protocol (TCP/IP).

The communications system 100 also may include relay stations (e.g., relay BS 110d). A relay station is an entity that can receive a transmission of data from an upstream station (for example, a base station or a mobile device) and send a transmission of the data to a downstream station (for example, a wireless device or a base station). A relay station also may be a mobile device that can relay transmissions for other wireless devices. In the example illustrated in FIG. 1, a relay station 110d may communicate with macro the base station 110a and the wireless device 120d in order to facilitate communication between the base station 110a and the wireless device 120d. A relay station also may be referred to as a relay base station, a relay base station, a relay, etc.

The communications system 100 may be a heterogeneous network that includes base stations of different types, for example, macro base stations, pico base stations, femto base stations, relay base stations, etc. These different types of base stations may have different transmit power levels, different coverage areas, and different impacts on interference in communications system 100. For example, macro base stations may have a high transmit power level (for example, 5 to 40 Watts) whereas pico base stations, femto base stations, and relay base stations may have lower transmit power levels (for example, 0.1 to 2 Watts).

A network controller 130 may couple to a set of base stations and may provide coordination and Control for these base stations. The network controller 130 may communicate with the base stations via a backhaul. The base stations also may communicate with one another, for example, directly or indirectly via a wireless or wireline backhaul.

The wireless devices (UE computing devices) 120a, 120b, 120c may be dispersed throughout communications system 100, and each wireless device may be stationary or mobile. A wireless device also may be referred to as an Access terminal, a UE, a terminal, a mobile station, a subscriber unit, a station, etc.

A macro base station 110a may communicate with the communication network 140 over a wired or wireless communication link 126. The wireless devices 120a, 120b, 120c may communicate with a base station 110a-110d over a wireless communication link 122.

The wireless communication links 122, 124 may include a plurality of carrier signals, frequencies, or frequency bands, each of which may include a plurality of logical channels. The wireless communication links 122 and 124 may utilize one or more radio Access technologies (RATs). Examples of RATs that may be used in a wireless communication link include 3GPP LTE, 3G, 4G, 5G (e.g., NR), GSM, Code Division Multiple Access (CDMA), Wideband Code Division Multiple Access (WCDMA), Worldwide Interoperability for Microwave Access (WiMAX), Time Division Multiple Access (TDMA), and other mobile telephony communication technologies cellular RATs. Further examples of RATs that may be used in one or more of the various wireless communication links 122, 124 within the communication system 100 include medium range protocols such as Wi-Fi, LTE-U, LTE-Direct, LAA, MuLTEfire, and relatively short range RATs such as ZigBee, Bluetooth, and Bluetooth Low Energy (LE).

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block") may be 12 subcarriers (or 180 kHz). Consequently, the nominal Fast File Transfer (FFT) size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While descriptions of some embodiments may use terminology and examples associated with LTE technologies, various embodiments may be applicable to other wireless communications systems, such as a new radio (NR) or 5G network. NR may utilize OFDM with a cyclic prefix (CP) on the uplink (UL) and downlink (DL) and include support for half-duplex operation using time division duplex (TDD). A single component carrier bandwidth of 100 MHz may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL Control data. Beamforming may be supported and beam direction may be dynamically configured. Multiple Input Multiple Output (MIMO) transmissions with precoding may also be supported. MIMO configurations in the DL may support up to eight transmit antennas with multi-layer DL transmissions up to eight streams and up to two streams per wireless device. Multi-layer transmissions with up to 2 streams per wireless device may be supported. Aggregation of multiple cells may be supported with up to eight serving cells. Alternatively, NR may support a different air interface, other than an OFDM-based air interface.

Some mobile devices may be considered machine-type communication (MTC) or evolved or enhanced machine-type communication (eMTC) mobile devices. MTC and eMTC mobile devices include, for example, robots, drones, remote devices, sensors, meters, monitors, location tags, etc., that may communicate with a base station, another device (for example, remote device), or some other entity. A wireless node may provide, for example, connectivity for or to a network (for example, a wide area network such as Internet or a cellular network) via a wired or wireless communication link. Some mobile devices may be considered Internet-of-Things (IoT) devices or may be implemented as NB-IoT (narrowband internet of things) devices. A wireless device 120*a*-*e* may be included inside a housing that houses components of the wireless device, such as processor components, memory components, similar components, or a combination thereof.

In general, any number of communications systems and any number of wireless networks may be deployed in a given geographic area. Each communications system and wireless network may support a particular radio Access technology (RAT) and may operate on one or more frequencies. A RAT also may be referred to as a radio technology, an air interface, etc. A frequency also may be referred to as a carrier, a frequency channel, etc. Each frequency may support a single RAT in a given geographic area in order to avoid interference between communications systems of different RATs. In some cases, NR or 5G RAT networks may be deployed.

In some implementations, two or more mobile devices 120*a*-*e* (for example, illustrated as the wireless device 120*a* and the wireless device 120*e*) may communicate directly using one or more sidelink channels 124 (for example, without using a base station 110*a*-110*d* as an intermediary to communicate with one another). For example, the wireless devices 120*a*-*e* may communicate using peer-to-peer (P2P) communications, device-to-device (D2D) communications, a vehicle-to-everything (V2X) protocol (which may include a vehicle-to-vehicle (V2V) protocol, a vehicle-to-infrastructure (V2I) protocol, or similar protocol), a mesh network, or similar networks, or combinations thereof. In this case, the wireless device 120*a*-*e* may perform scheduling operations, resource selection operations, as well as other operations described elsewhere herein as being performed by the base station 110*a*-110*d*.

Figure 2:
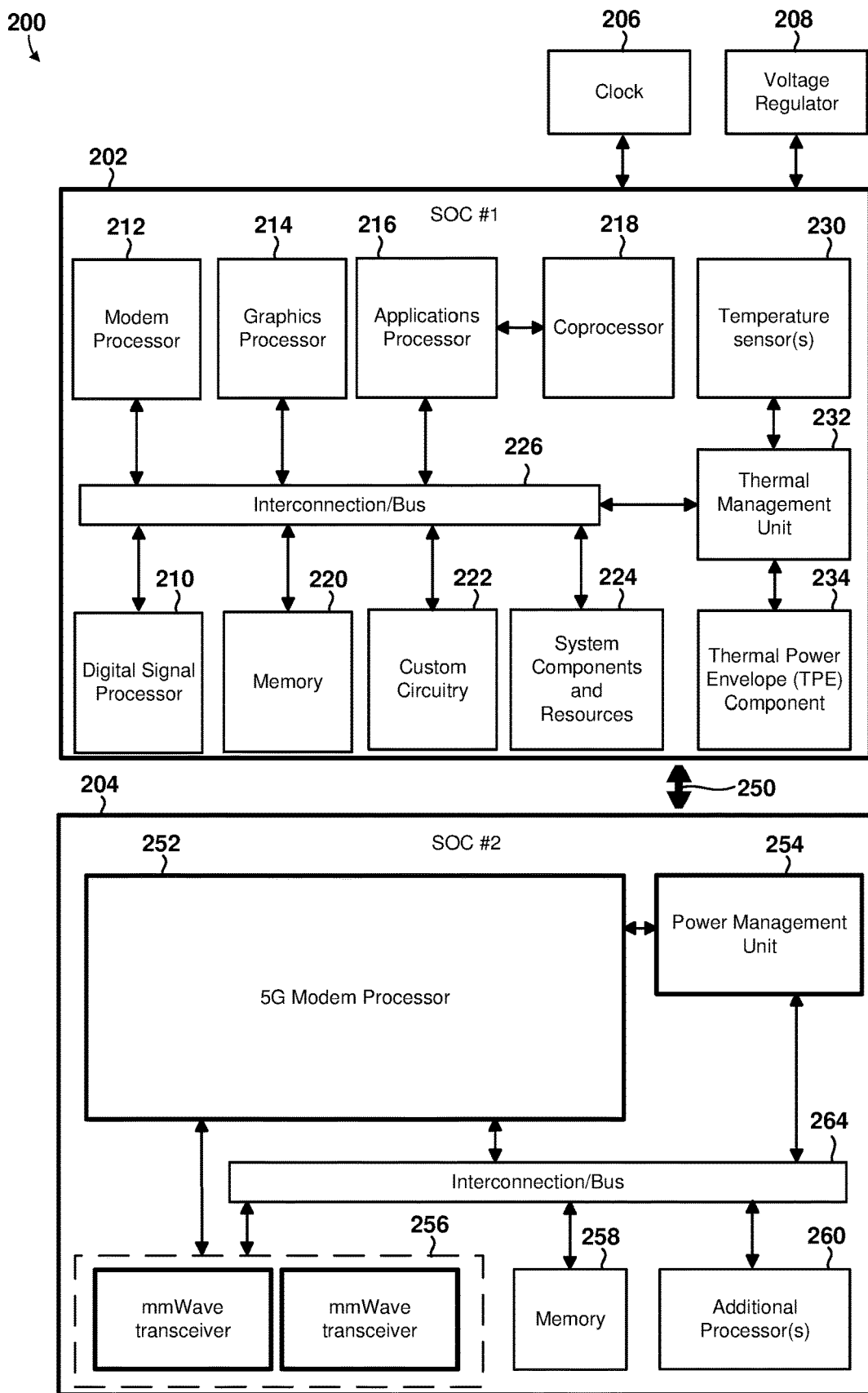
FIG. 2 is a component block diagram illustrating an example computing system and wireless modem suitable for implementing various embodiments.

Various embodiments may be implemented on a number of single processor and multiprocessor computer systems, including a system-on-chip (SOC) or system in a package (SIP). FIG. 2 illustrates an example computing system or SIP 200 architecture that may be used in wireless devices (UE computing devices) implementing the various embodiments.

With reference to FIGS. 1 and 2, the illustrated example SIP 200 includes a two SOCs 202, 204, a clock 206, and a voltage regulator 208. In some embodiments, the first SOC 202 operate as central processing unit (CPU) of the wireless device that carries out the instructions of software application programs by performing the arithmetic, logical, Control and input/output (I/O) operations specified by the instructions. In some embodiments, the second SOC 204 may operate as a specialized processing unit. For example, the second SOC 204 may operate as a specialized 5G processing unit responsible for managing high volume, high speed (e.g., 5 Gbps, etc.), and/or very high frequency short wave length (e.g., 28 GHz mmWave spectrum, etc.) communications.

The first SOC 202 may include a digital signal processor (DSP) 210, a modem processor 212, a graphics processor 214, an application processor 216, one or more coprocessors 218 (e.g., vector co-processor) connected to one or more of the processors, memory 220, custom circuitry 222, system components and resources 224, an interconnection/bus module 226, one or more temperature sensors 230, a thermal Management unit 232, and a thermal power envelope (TPE) component 234. The second SOC 204 may include a 5G modem processor 252, a power Management unit 254, an interconnection/bus module 264, a plurality of mmWave transceivers 256, memory 258, and various additional processors 260, such as an applications processor, packet processor, etc.

Each processor 210, 212, 214, 216, 218, 252, 260 may include one or more cores, and each processor/core may perform operations independent of the other processors/cores. For example, the first SOC 202 may include a processor that executes a first type of operating system (e.g., FreeBSD, LINUX, OS X, etc.) and a processor that executes a second type of operating system (e.g., MICROSOFT WINDOWS 10). In addition, any or all of the processors 210, 212, 214, 216, 218, 252, 260 may be included as part of a processor cluster architecture (e.g., a synchronous processor cluster architecture, an asynchronous or heterogeneous processor cluster architecture, etc.).

The first and second SOC 202, 204 may include various system components, resources and custom circuitry for managing sensor data, analog-to-digital conversions, wireless data transmissions, and for performing other specialized operations, such as decoding data packets and processing encoded audio and video signals for rendering in a web browser. For example, the system components and resources 224 of the first SOC 202 may include power amplifiers, voltage regulators, oscillators, phase-locked loops, peripheral bridges, data controllers, memory controllers, system controllers, Access ports, timers, and other similar components used to support the processors and software clients running on a wireless device. The system components and resources 224 and/or custom circuitry 222 may also include circuitry to interface with peripheral devices, such as cameras, electronic displays, wireless communication devices, external memory chips, etc.

The first and second SOC 202, 204 may communicate via interconnection/bus module 250. The various processors 210, 212, 214, 216, 218, may be interconnected to one or more memory elements 220, system components and resources 224, and custom circuitry 222, and a thermal Management unit 232 via an interconnection/bus module 226. Similarly, the processor 252 may be interconnected to the power Management unit 254, the mmWave transceivers 256, memory 258, and various additional processors 260 via the interconnection/bus module 264. The interconnection/bus module 226, 250, 264 may include an array of reconfigurable logic gates and/or implement a bus architecture (e.g., CoreConnect, AMBA, etc.). Communications may be provided by advanced interconnects, such as high-performance networks-on chip (NoCs).

The first and/or second SOCs 202, 204 may further include an input/output module (not illustrated) for communicating with resources external to the SOC, such as a clock 206 and a voltage regulator 208. Resources external to the SOC (e.g., clock 206, voltage regulator 208) may be shared by two or more of the internal SOC processors/cores.

In addition to the example SIP 200 discussed above, various embodiments may be implemented in a wide variety of computing systems, which may include a single processor, multiple processors, multicore processors, or any combination thereof.

Figure 3:
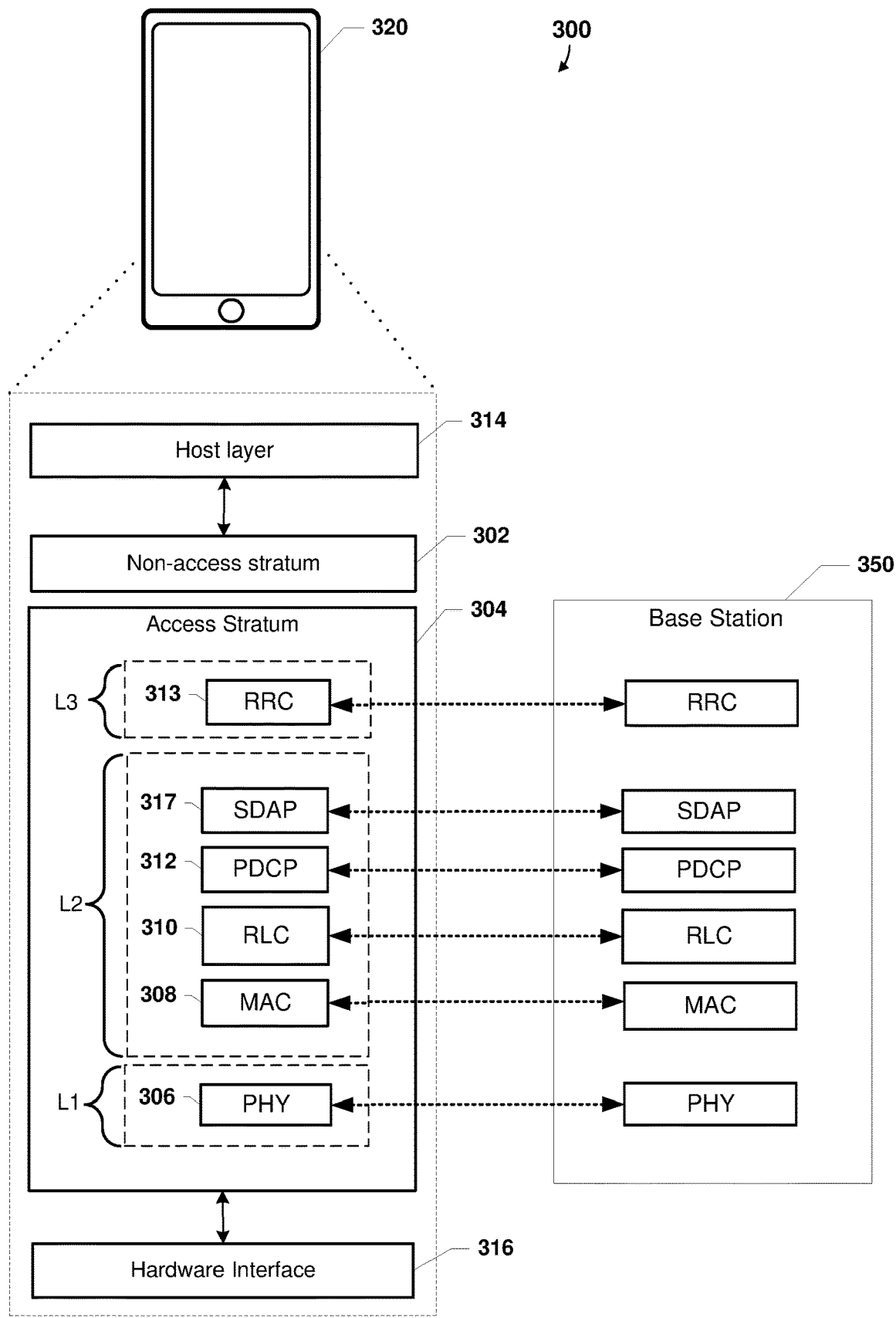
FIG. 3 is a component block diagram illustrating a software architecture including a radio protocol stack for the user and control planes in wireless communications suitable for implementing various embodiments.

FIG. 3 is a component block diagram illustrating a software architecture 300 including a radio protocol stack, also referred to as a wireless protocol stack, for the user and control planes in wireless communications suitable for implementing any of the various embodiments. With reference to FIGS. 1-3, the wireless device 320 may implement the software architecture 300 to facilitate communication between a wireless device 320 (e.g., the wireless device 120a-120e, 200) and the base station 350 (e.g., the base station 110a-d) of a communication system (e.g., 100). In some embodiments, layers in software architecture 300 may form logical connections with corresponding layers in software of the base station 350. The software architecture 300 may be distributed among one or more processors (e.g., the processors 212, 214, 216, 218, 252, 260). While illustrated with respect to one radio protocol stack (or one wireless protocol stack), in a multi-SIM (subscriber identity module) wireless device, the software architecture 300 may include multiple protocol stacks, each of which may be associated with a different SIM (e.g., two protocol stacks associated with two SIMs, respectively, in a dual-SIM wireless communication device). While described below with reference to LTE communication layers, the software architecture 300 may support any of variety of standards and protocols for wireless communications, and/or may include additional protocol stacks that support any of variety of standards and protocols wireless communications.

The software architecture 300 may include a Non-Access Stratum (NAS) 302 and an Access Stratum (AS) 304. The NAS 302 may include functions and protocols to support Packet filtering, security management, mobility control, session management, and traffic and signaling between a SIM(s) of the wireless device and its core network 140. The AS 304 may include functions and protocols that support communication between a SIM(s) and entities of supported access networks (e.g., a base station). In particular, the AS 304 may include at least three layers (Layer 1, Layer 2, and Layer 3), each of which may contain various sub-layers.

In the user and control planes, Layer 1 (L1) of the AS 304 may be a physical layer (PHY) 306, which may oversee functions that enable transmission and/or reception over the air interface. Examples of such physical layer 306 functions may include cyclic redundancy check (CRC) attachment, coding blocks, scrambling and descrambling, modulation and demodulation, signal measurements, MIMO, etc. The PHY layer 306 may include various logical channels, including the Physical Downlink Control Channel (PDCCH) and the Physical Downlink Shared Channel (PDSCH). As an example, the PHY layer 306 may support Channel State Information (CSI) measurements and reporting (e.g., Channel Quality Indicator (CQI) measurements and reporting).

In the user and control planes, Layer 2 (L2) of the AS 304 may be responsible for the link between the wireless device 320 and the base station 350 over the physical layer 306. In the various embodiments, Layer 2 may include a Media Access Control (MAC) sublayer 308, a Radio Link Control (RLC) sublayer 310, a Packet Data Convergence Protocol (PDCP) 312 sublayer, and a Service Data Adaptation Protocol (SDAP) 317 sublayer, each of which form logical connections terminating at the base station 350.

In the control plane, Layer 3 (L3) of the AS 304 may include a Radio Resource Control (RRC) sublayer 3. While not shown, the software architecture 300 may include additional Layer 3 sublayers, as well as various upper layers above Layer 3. In various embodiments, the RRC sublayer 313 may provide functions including broadcasting system information, paging, and establishing and releasing an RRC signaling connection between the wireless device 320 and the base station 350.

In various embodiments, the SDAP sublayer 317 may provide mapping between Quality of Service (QoS) flows and data radio bearers (DRBs). In various embodiments, the PDCP sublayer 312 may provide uplink functions including multiplexing between different Radio bearers and logical channels, sequence number addition, handover data handling, integrity protection, ciphering, and header compression. In the downlink, the PDCP sublayer 312 may provide functions that include in-sequence delivery of data packets, duplicate data Packet detection, integrity validation, deciphering, and header decompression.

In the uplink, the RLC sublayer 310 may provide segmentation and concatenation of upper layer data packets, retransmission of lost data packets, and Automatic Repeat Request (ARQ). In the downlink, while the RLC sublayer 310 functions may include reordering of data packets to compensate for out-of-order reception, reassembly of upper layer data packets, and ARQ.

In the uplink, MAC sublayer 308 may provide functions including multiplexing between logical and transport channels, random access procedure, logical channel priority, and hybrid-ARQ (HARQ) operations. In the downlink, the MAC layer functions may include channel mapping within a cell, de-multiplexing, discontinuous reception (DRX), and HARQ operations.

While the software architecture 300 may provide functions to transmit data through physical media, the software architecture 300 may further include at least one host layer 314 to provide data transfer services to various applications in the wireless device 320. In some embodiments, application-specific functions provided by the at least one host layer 314 may provide an interface between the software architecture and the general purpose processor.

In other embodiments, the software architecture 300 may include one or more higher logical layer (e.g., transport, session, presentation, application, etc.) that provide host layer functions. In some embodiments, the software architecture 300 may include an application layer in which a logical connection terminates at another device (e.g., end user device, server, etc.). In some embodiments, the software architecture 300 may further include in the AS 304 a hardware interface 316 between the physical layer 306 and the communication hardware (e.g., one or more radio frequency (RF) transceivers).

Wireless communications between two devices, such as communications between a base station (e.g., the base station 110a-110d, 350) and a wireless device (e.g., the wireless device 120a-120e, 200, 320), may be susceptible to interference or other challenges which may interrupt or impair the wireless communication. To mitigate such impairments, a sending device (e.g., either of the base station or the wireless device) may select a coding scheme based on channel conditions. For clarity, the various examples discussed herein may refer to a sending device and a receiving device to indicate the direction of data for a particular example. When one device, such as the wireless device (e.g., the wireless device 120a-120e, 200, 320) is a sending device in a wireless communication, the other device, such as the base station (e.g., the base station 110a-110d, 350) may be the receiving device, and vice versa.

A wireless transmission may be encoded to include error checking and redundancy information that enables a receiving device (e.g., either of the base station or the wireless device) to detect and sometimes correct errors in the wireless transmission. The receiving device may send a feedback message, such as a feedback message including an acknowledgment (ACK) or negative acknowledgment (NACK), to the sending device to indicate whether the data was successfully received. Based on the feedback message, the sending device may select a different coding scheme, may send a retransmission to assist the receiving device in decoding the data, or both. Some retransmission protocols aim to balance the benefits of a faster coding scheme with the loss in effective data rate that results from excessive retransmissions.

One example of a retransmission protocol is Hybrid Automatic Repeat Request (HARD). Devices (e.g., the base station 110a-110d, 350 and/or the wireless device 120a-120e, 200, 320) may implement HARQ protocols to improve throughput, reliability of wireless communication, or both. A sending device may transmit data according to a HARQ protocol. The HARQ protocol may be based on code block encoding that supports error detection and error correction by the receiving device. The receiving device may verify that the code block is properly decoded using error checking. When error checking fails, the receiving device may attempt error correction to recover and properly decode the code block. In a traditional HARQ protocol, the receiving device may send feedback indicating which code blocks were successfully decoded and which code blocks the receiving device has failed to decode. For each code block that the receiving device has failed to decode, the sending device may transmit a HARQ retransmission that includes additional error correction data, the original code block, part of the original code block, or any combination thereof, in accordance with the established HARQ protocol.

The probability that a code block is successfully decoded may depend on a modulation and coding scheme (MCS) utilized for a HARQ transmission. The MCS may define a coding rate, a bit puncturing rate, a modulation type, or any combination thereof. Typically, a lower MCS is associated with less throughput and higher probability of decoding (i.e., more reliable transmissions and thus fewer retransmissions at the price of lower throughput). In contrast, a higher MCS may be associated with higher throughput and a lower probability of decoding (i.e., greater throughput at the price of less reliable transmission, which may require more retransmissions). Some systems may attempt to strike a balance between throughput and transmission reliability by selecting an MCS that results in the highest effective data rate. The effective data rate of a wireless communication medium may be based on the throughput associated with successfully decoded transmissions. Failed decoding and retransmissions may lower the effective data rate.

One technique used to improve HARQ protocols may be a Multiple Incremental Redundancy Scheme (MIRS). MIRS may decrease the airtime associated with retransmissions such that a threshold quantity of decoding failures is acceptable to increase overall throughput. In MIRS, rather than trying to predict channel capacity using the Channel State Information Reference Signal (CSR-RS), incremental redundancy (IR) HARQ (IR-HARQ) may be used to find a MCS resulting in the highest effective data rate for a current channel.

In MIRS, a first transmission (Tx) may be sent by the sending device (e.g., the base station 110a-110d, 350 and/or the wireless device 120a-120e, 200, 320) at nearly a maximum coding rate or nearly a highest MCS supported by the current channel. For example, in 3GPP the maximum coding rate may be one and the highest MCS supported may be MCS 28 and as such the first Tx may be sent at MCS 27 and a coding rate slightly less than one. In this manner, there may be very little redundancy in the first Tx. If the receiving device (e.g., the base station 110a-110d, 350 and/or the wireless device 120a-120e, 200, 320) successfully decodes the data of the first Tx, the highest effective data rate for the current channel is achieved (e.g., MCS 27 if the first Tx is successfully decoded when the first Tx is sent at MCS 27).

In MIRS, if the receiving device (e.g., the base station 110a-110d, 350 and/or the wireless device 120a-120e, 200, 320) does not successfully decode the data, a NACK feedback message may be sent from the receiving device to the sending device. In response to receiving the NACK feedback message, the sending device (e.g., the base station 110a-110d, 350 and/or the wireless device 120a-120e, 200, 320) may reduce the coding rate for a next transmission by an increment, such as one MCS level, thereby slightly reducing the coding rate. For example, when the initial MCS was MCS 27 for the first Tx, the MCS for the next retransmission (Re-Tx) may be reduced to MCS 26. The next Re-Tx may be small (or thin), having some small additional redundancy not present in the first Tx. The sending device may transmit the next Re-Tx to the receiving device. If the receiving device successfully decodes the data of the Re-Tx, the highest effective data rate for the current channel is presumed to be achieved (e.g., MCS 26 if the Re-Tx is successfully decoded when the Re-Tx is sent at MCS 26). In MIRS, if the receiving device does not successfully decode the data, another NACK feedback message may be sent from the receiving device to the sending device.

In response to receiving another NACK feedback message, the sending device (e.g., the base station 110a-110d, 350 and/or the wireless device 120a-120e, 200, 320) may reduce the coding rate again for a next transmission by an increment, such as one MCS level, thereby slightly reducing the coding rate again and may transmit another subsequent Re-Tx at the further reduced coding rate. The subsequent Re-Tx may include an additional small amount of redundancy greater than that of the previous Re-Tx. The NACK, MCS reduction, and Re-Tx with additional redundant data cycle may continue as long as NACK feedback messages are received from the sending device. Once NACK feedback messages are no longer received, the highest effective data rate for the current channel may be achieved at whatever MCS level the successful Re-Tx occurred. In this manner, a suitable MCS with the necessary amount of redundancy is gradually arrived at by the NACK, MCS reduction, and Re-Tx with additional redundant data cycle. The achievement of the highest effective data rate for the current channel results in the maximum (or near maximum) capacity code rate for the current channel being achieved without requiring a prediction of the channel capacity. Additionally, MIRS enables the effective data rate for transmissions to track the channel capacity, even if channel capacity is rapidly changing.

In MIRS, as Re-Tx for each code block (CB) may include a small number of additional redundancy bits, a very large number of code blocks (CBs) and transport blocks (TBs) may be multiplexed in a single transmission time interval (TTI). As MIRS may be implemented to provide feedback on a per CB or per small CB group (CBG) basis, a large number of bits may need to be sent as feedback, such as NACK feedback and/or ACK feedback. Compressing the number of feedback bits may reduce the impact on system performance of the MIRS procedure for selecting an appropriate MCS for a given channel at a given time.

Figure 4:
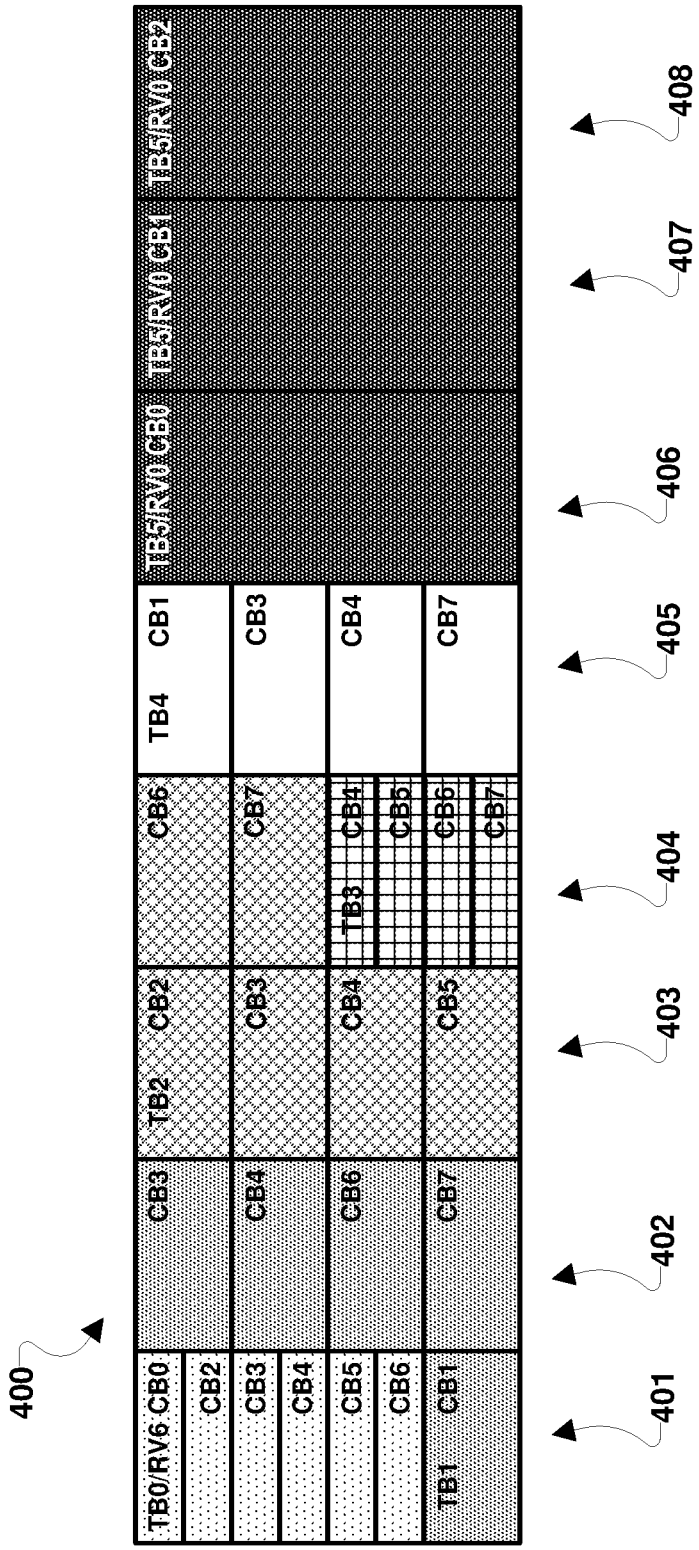
FIG. 4 is a block diagram of an example portion of a Multiple Incremental Redundancy Scheme (MIRS) slot.

FIG. 4 is a block diagram of an example portion 400 of a MIRS slot illustrating examples of different numbers of code blocks (CBs) per transport block (TB). With reference to FIGS. 1-4, while a typical MIRS slot has 14 symbols per slot, FIG. 4 illustrates the portion 400 having eight different symbols 401, 402, 403, 404, 405, 406, 407, 408. Five different TBs, TB0, TB1, TB2, TB3, TB4, and TB5 are illustrated and each TB has its own respective CBs. For example, TB0 has CBs, CB0, CB2, CB3, CB4, CB5, and CB7, TB1 has CBs, CB1, CB3, CB4, CB6, and CB7, TB2 has CBs, CB2, CB3, CB4, CBS, CB6, and CB7, TB3 has CBs, CB4, CB5, CB6, CB7, TB4 has CBs, CB1, CB3, CB4, and CB7, and TB5 has CBs, CB0, CB1, and CB2. As illustrated in FIG. 4, different symbols 401-408 may have different TBs therein.

Each TB in a MIRS slot may be, and typically is, a retransmission (Re-Tx) of a previously failed TB. The number of Re-Txs may vary from TB to TB. For example, TB0 may be in a second Re-Tx cycle, TB1 may be in a third Re-Tx cycle, etc. As more redundant data is added in each successive Re-Tx cycle in MIRS, the probability of successfully decoding varies between TBs in different Re-Tx cycles. For example, a TB in its third Re-Tx cycle is more likely to pass a cyclic redundancy check (CRC) and be successfully decoded than a TB that is in its second Re-Tx as the TB in the third Re-Tx cycle may have more redundant data than the TB in the second Re-Tx cycle.

To support faster retransmission cycles, it may be desirable to send feedback for a portion of a symbol, every symbol, or every small number of symbols. Each portion of a symbol, each symbol, or each group of symbols, may be a feedback group. Feedback groups may be defined by a number of CBs such that a feedback group may have a number of CBs less than a full a symbol, a number of CBs equal to a full symbol, or a number of CBs greater than a symbol. Each feedback group, such as each portion of a symbol, each symbol, or each group of symbols, may be characterized by a number of CBs in the feedback group to acknowledge (ACK) or negative acknowledge (NACK) and a probability of ACK or NACK per CB. The probability of ACK or NACK per CB may be based at least in part on the number of Re-Tx cycles of that CB. Additionally or alternatively, the probability of ACK or NACK per CB may be based on one or more other factors including an existence of spurs and/or notches in frequency and/or time, a proximity of a demodulated reference signal (DMRS), a current estimated signal-to-noise ratio (SNR), a current number of MIMO layers, etc. The probability of ACK or NACK per CB may be represented by a probability of successful decoding "p". The probability of successful decoding "p" may represent the probability that a CB is successfully decoded. The probability of successful decoding "p" may be based at least in part on one or more factors including, the number of re-Tx cycles of that CB, an existence of spurs and/or notches in frequency and/or time, a proximity of a DMRS, a current estimated SNR, a current number of MIMO layers, etc.

For example, referring to the MIRS slot portion 400, the first symbol 401 may include information for seven CBs, CB0 of TB0, CB2 of TB0, CB3 of TB0, CB4 of TB0, CB5 of TB0, CB7 of TB0, and CB1 of TB1. Each CB may have its own respective probability of successful decoding "p", such that there may be seven probabilities of successful decoding "p" for the first symbol 401, specifically $p_0$-$p_6$. For example, where the probability of successful decoding "p" is governed mainly by the Re-Tx cycles, if the CBs of TB0 (CB0, CB2, CB3, CB4, CB5, and CB7) are in their second Re-Tx cycle their probabilities may all be the same such that $p_0=p_1=p_2=p_3=p_4=p_5=p_{Tx2}$ where $p_{Tx2}$ is the probability of successful decoding "p" associated with a second Re-Tx cycle. Similarly, if the CB of TB (CB1) is in its third Re-Tx cycle its probability may be equal to the probability of successful decoding "p" associated with a third Re-Tx cycle "$p_{Tx3}$" such that $p_6=p_{Tx3}$.

Similarly, feedback on the fourth symbol 404 may include six CBs, CB6 of TB2, CB7 of TB2, CB4 of TB3, CB5 of TB3, CB6 of TB3, and CB7 of TB3 with the CBs of TB2 (CB6 and CB7) having a first probability of successful decoding "$p_A$" (e.g., $p_0=p_1=p_A$) and the CBs of TB3 (CB4, CB5, CB6, and CB7) having a second probability of successful decoding "$p_B$" (e.g., $p_2=p_3=p_4=p_5=p_B$).

Various embodiments may include systems and methods for supporting lossy compression of feedback information, such as ACK information, NACK information, etc. Various embodiments may support lossy compression for feedback messages in retransmission systems, such as HARQ protocols, MIRS, etc. Various embodiments may support compression of feedback bits using a different compression codebook per feedback group, such as per portion of a symbol, per symbol, or per group of symbols. Various embodiments may support selection of a compression codebook per feedback group, such as per portion of a symbol, per symbol, or per group of symbols, based at least in part on a probability of successful decoding of each code block in the symbol or group of symbols.

In various embodiments, the feedback bits required per feedback group, such as per portion of a symbol, per symbol, or per group of symbols, may be compressed by reducing (e.g., minimizing) an expected penalty of compression given a fixed number of bits used to send the feedback. The expected penalty of compression given a fixed number of feedback bits may be a rate distortion measure "D". In various embodiments, lossy compression of feedback information may be selected to reduce (e.g., minimize) the rate distortion measure "D". The expected penalty may be the expected number of superfluous CBs the sending device (e.g., the base station 110a-110d, 350 and/or the wireless device 120a-120e, 200, 320) may retransmit that would not have been retransmitted if uncompressed (e.g., optimal) feedback bits had been used. The rate of distortion measure "D" is therefore the expectation of the excess retransmission the sending device will send to the receiving device above (or on top of) the retransmission that is required.

The rate of distortion measure "D" may be determined according to the equation:

$$D=E_n[d(x_n, g(f(x_n)))]$$

where $x_n$ is the uncompressed n-th message from a set of $|x|=2^N$ messages, and $f(\ )$ and $g(\ )$ are the compression and decompression functions, respectively. $g(f(x_n))$ is the feedback response the sending device will act upon, from set of $|g(f(x))|=K$ messages. [m] represents the m-th bit in the message, $x_n[m]$. $g(f(x_n))[m]$ is the m-the bit in the original message and reconstructed (compressed) message, respectively, assuming '1' is NACK and '0'—is ACK, where m=0, ... N−1 (for N CBs to send feedback on). Finally:

$$d(x_n, g(f(x_n))) = \begin{cases} \infty & x_n[m]=1, g(f(x_n))[m]=0 \text{ for any } m \\ \sum_m (g(f(x_n))[m] - x_n[m]) & \text{otherwise} \end{cases}$$

If the compression scheme results in sending Re-Tx for a successfully decoded CB, the corresponding distortion is increased by one for every such CB. If the compression scheme resulted in not sending Re-Tx for a failed CB, the distortion for this case may be defined as infinite and such case may be avoided.

In various embodiments, a selected signaling compression codebook to use for compressing feedback bits may be determined on a per feedback group, such as per portion of a symbol, per symbol, or per group of symbols, basis. A selected signaling compression codebook may be a codebook of the available codebooks that reduces (e.g., minimizes) the rate of distortion measure "D". Given a number "N" of CBs to feedback ACK and/or NACK with probabilities of successful decoding "$p_0 \ldots p_{N-1}$" and given a fixed number of bits as feedback, or equivalently K number of waveforms for feedback where the fixed number of bits as feedback is then $\log_2(K)$ where $K<2^N$, the selected signaling compression codebook may be the codebook of the available codebooks that reduces (e.g., minimizes) the rate of distortion measure "D." Said another way, the selected signaling compression codebook may be the codebook of the available codebooks resulting a lowest rate of distortion measure "D" from among all the available codebooks.

The selected signaling compression codebook being a codebook of the available codebooks that reduces (e.g., minimizes) the rate of distortion measure "D" may not be equivalent to standard compression approaches, because standard compression approaches minimize the average size. In the compression schemes according to the various embodiments, the worst-case feedback per symbol is minimized, not the average size. As various embodiments minimize the worst-case feedback per symbol, the various embodiments differ from standard compressions algorithms such as standard lossless compression algorithms (e.g., Huffman) or standard lossy compression algorithms (e.g., Blahut-Arimoto).

In various embodiments, a different compression codebook may be used per feedback group, such as per portion of a symbol, per symbol, or per group of symbols, based a combination of current the probabilities of successful decoding "p" for the CBs to be retransmitted. As the probability of successful decoding "p" may change every Re-Tx cycle, different codebooks may be selected per feedback group, such as per portion of a symbol, per symbol, or per group of symbols, based on the current probabilities of successful decoding "p" for the CBs. In various embodiments, compression codebook selection may be based at least in part on a number of CBs to feedback "N", a number of waveforms to be used for feedback "K", and probabilities of successful decoding "$p_0 \ldots p_{N-1}$".

In various embodiments, probabilities of successful decoding "p" may be probability values pre-provisioned to (i.e., pre-stored in) a device, such as a receiving device (e.g., the base station 110a-110d, 350 and/or the wireless device 120a-120e, 200, 320), sending device (e.g., the base station 110a-110d, 350 and/or the wireless device 120a-120e, 200, 320), etc. In various embodiments, both the receiving device (e.g., the base station 110a-110d, 350 and/or the wireless device 120a-120e, 200, 320) and the sending device (e.g., the base station 110a-110d, 350 and/or the wireless device 120a-120e, 200, 320) may be configured with the same probabilities of successful decoding "p".

In some embodiments, probabilities of successful decoding "p" may be pre-defined mappings of Re-Tx cycle numbers to probability values stored in a memory of a device, such as the receiving device (e.g., the base station 110a-110d, 350 and/or the wireless device 120a-120e, 200, 320) and the sending device (e.g., the base station 110a-110d, 350 and/or the wireless device 120a-120e, 200, 320), etc. As an example, the pre-defined mapping may be a look-up table (LUT) correlating successive Re-Tx cycle numbers with respective probability values.

In some embodiments, the pre-defined mapping of Re-Tx cycle numbers to probability values may be generated by a sending device. For example, a sending device (e.g., the base station 110a-110d, 350 and/or the wireless device 120a-120e, 200, 320) may determine probabilities of successful decoding "p" for various different Re-Tx cycles based at least in part on one or more factors including, the number of the re-Tx cycle, an existence of spurs and/or notches in frequency and/or time, a proximity of a DMRS, a current estimated SNR, a current number of MIMO layers, etc. In some embodiments, the pre-defined mapping of Re-Tx cycle numbers to probability values may be provided from a sending device to a receiving device. In a non-limiting example, a base station (e.g., the base station 110a-110d, 350) may send the pre-defined mapping as a LUT to a wireless device (e.g., the wireless device 120a-120e, 200, 320) in one or more Radio Resource Control (RRC) messages. As another example, a base station (e.g., the base station 110a-110d, 350) may send the pre-defined mapping as a LUT to a wireless device (e.g., the wireless device 120a-120e, 200, 320) in one or more Media Access Control (MAC) Control Element (CE) (MAC-CE) messages.

In some embodiments, the pre-defined mapping of Re-Tx cycle numbers to probability values may be updated (or adapted) based on one or more dynamic parameters observed by the sending device (e.g., the base station 110a-110d, 350 and/or the wireless device 120a-120e, 200, 320), such as channel response, mappings of various code blocks, etc. For example, values in a LUT in which Re-Tx cycle numbers are correlated with probabilities of successful decoding "p" may be updated based on one or more dynamic parameters observed by the sending device, such as channel response, mappings of various code blocks, etc. The sending device may signal the updated values per allocation in the Downlink Control Information (DCI).

In some embodiments, the pre-defined mapping of Re-Tx cycle numbers to probability values may be updated (or adapted) based on adaptation rules available to the receiving device (e.g., the base station 110a-110d, 350 and/or the wireless device 120a-120e, 200, 320) and/or sending device (e.g., the base station 110a-110d, 350 and/or the wireless device 120a-120e, 200, 320). The adaptation rules may govern how probabilities of successful decoding "p" in the pre-defined mapping of Re-Tx cycle numbers to probability values may be changed based on observed conditions. As an example, an adaptation rule may indicate that if a CB is observed to fall on a spur location in frequency, the probability values for that CB may be decreased. As another example, an adaptation rule may indicate that if a CB is far from DMRSs, the probability values for that CB may be decreased.

In some embodiments, the adaptation rules may be provided from a sending device to a receiving device. In a non-limiting example, a base station (e.g., the base station 110a-110d, 350) may send adaptation rules to a wireless device (e.g., the wireless device 120a-120e, 200, 320) in one or more RRC messages. In another example, a base station (e.g., the base station 110a-110d, 350) may send the adaptation rules to a wireless device (e.g., the wireless device 120a-120e, 200, 320) in one or more MAC-CE messages. In response to receiving adaptation rules, the sending device (e.g., the base station 110a-110d, 350 and/or the wireless device 120a-120e, 200, 320) may apply the adaptation rules to adjust the probabilities of successful decoding "p" used for various CBs.

In some embodiments, combinations of both updating the pre-defined mapping of Re-Tx cycle numbers to probability values based on one or more dynamic parameters observed by the sending device (e.g., the base station 110a-110d, 350 and/or the wireless device 120a-120e, 200, 320), such as channel response, mappings of various code blocks, etc. and updating the pre-defined mapping of Re-Tx cycle numbers to probability values may be updated (or adapted) based on adaptation rules available to the receiving device (e.g., the base station 110a-110d, 350 and/or the wireless device 120a-120e, 200, 320) and/or sending device (e.g., the base station 110a-110d, 350 and/or the wireless device 120a-120e, 200, 320) may be implemented together.

In some embodiments, a number of CBs to feedback "N" may be pre-configured by a device, such as a receiving device (e.g., the base station 110a-110d, 350 and/or the wireless device 120a-120e, 200, 320), or a sending device (e.g., the base station 110a-110d, 350 and/or the wireless device 120a-120e, 200, 320), etc. In some embodiments, both the receiving device (e.g., the base station 110a-110d, 350 and/or the wireless device 120a-120e, 200, 320) and the sending device (e.g., the base station 110a-110d, 350 and/or the wireless device 120a-120e, 200, 320) may be configured with the same number of CBs to feedback "N". In some embodiments, the number of CBs to feedback "N" may be determined by a sending device based on receiving device advertised capabilities. For example, a receiving device may advertise that the receiving device is lossy compression and dynamic codebook capability enabled, and in response to the advertised capabilities the sending device may determine the number of CBs to feedback "N". In some embodiments, the number of CBs to feedback "N" may be provided from a sending device to a receiving device. In a non-limiting example, a base station (e.g., the base station 110a-110d, 350) may send the number of CBs to feedback "N" to a wireless device (e.g., the wireless device 120a-120e, 200, 320) in one or more RRC messages. In another example, a base station (e.g., the base station 110a-110d, 350) may send the number of CBs to feedback "N" to a wireless device (e.g., the wireless device 120a-120e, 200, 320) in one or more MAC-CE messages.

In some embodiments, a number of waveforms to be used for feedback "K" may be pre-configured by a device, such as a receiving device (e.g., the base station 110a-110d, 350 and/or the wireless device 120a-120e, 200, 320), or a sending device (e.g., the base station 110a-110d, 350 and/or the wireless device 120a-120e, 200, 320), etc. In some embodiments, both the receiving device (e.g., the base station 110a-110d, 350 and/or the wireless device 120a-120e, 200, 320) and the sending device (e.g., the base station 110a-110d, 350 and/or the wireless device 120a-120e, 200, 320) may be configured with the same number of waveforms to be used for feedback "K". In some embodiments, the number of waveforms to be used for feedback "K" may be determined by a sending device based on receiving device advertised capabilities. For example, a receiving device may advertise that the receiving device is lossy compression and dynamic codebook capability enabled, and in response to the advertised capabilities the sending device may determine the number of waveforms to be used for feedback "K". In some embodiments, the number of waveforms to be used for feedback "K" may be provided from a sending device to a receiving device. In a non-limiting example, a base station (e.g., the base station 110a-110d, 350) may send the number of waveforms to be used for feedback "K" to a wireless device (e.g., the wireless device 120a-120e, 200, 320) in one or more RRC messages. In another example, a base station (e.g., the base station 110a-110d, 350) may send the number of waveforms to be used for feedback "K" to a wireless device (e.g., the wireless device 120a-120e, 200, 320) in one or more MAC-CE messages.

In various embodiments, a receiving device (e.g., the base station 110a-110d, 350 and/or the wireless device 120a-120e, 200, 320) may receive transmissions of CBs, such as HARQ messages, for a symbol of a slot, such as a MIRS slot from a sending device (e.g., the base station 110a-110d, 350 and/or the wireless device 120a-120e, 200, 320). The sending device may send the transmissions of the CBs, such as HARQ transmissions, for the symbol of the slot, such as a MIRS slot from a sending device. The receiving device receives the transmission, such as the HARQ messages, and attempts to decode the CBs for the symbol of the slot.

A decoding attempt may include computation of logarithm likelihood ratios (LLRs) for different bit positions of the CB. The LLRs may be used to generate decoded data bits. The decoding attempt also may include computation of an error checking value that can be compared with error checking information embedded in the CB. A CB is successfully decoded when the receiving device can verify that the computed error checking value matches the error checking information embedded in the CB. In some implementations, the receiving device may attempt to use error correction to correct bit errors and compute another error checking value.

After a threshold number of decoding attempts, if the receiving device cannot verify the error checking value, the receiving device may determine that it has failed to decode the CB. A success or failure to decode a CB may be referred to as a decoding result. Successful decoding of a CB may be associated with an acknowledgement (ACK) condition, for example indicated by a bit value of "0" in feedback message. Failure to decode (or unsuccessful decoding of) a CB may be associated with a negative acknowledgement (NACK) condition, for example indicated by a bit value of "1" in a feedback message.

The receiving device may send a feedback message, such as a HARQ message, including an indication of the decoding results for the feedback group, such as the decoding results for the portion of the symbol, the decoding results for the symbol, or the decoding results for the group of symbols. The feedback message may include a feedback bitmap representing whether CBs in the feedback group, such as the portion of the symbol, the symbol, or the group of symbols, were successfully decoded. For example, bit positions in the feedback bitmap of a value "0" may indicate an ACK condition representing successful decoding of the CB associated with that bit position and bit positions in the feedback bitmap of a value "1" may indicate a NACK condition representing decoding failure of the CB associated with that bit position. The sending device may receive the feedback message, such as a HARQ message, from the receiving device, and the sending message may initiate Re-Tx of the failed decoding CBs based on the feedback bitmap in the feedback message.

In various embodiments, a non-compressed (or uncompressed) message may include feedback bitmaps for each possible combination of CB decoding outcomes of the feedback group, such as the portion of the symbol, the symbol, or the group of symbols. In some embodiments, a compression codebook may include feedback bitmaps for less than all possible combinations of CB decoding outcomes of the feedback group, such as the portion of the symbol, the symbol, or the group of symbols. In some embodiments, a compression codebook may be selected to generate feedback bitmaps for less than all possible combinations of CB decoding outcomes of the feedback group, such as the portion of the symbol, the symbol, or the group of symbols, thereby reducing an amount of feedback data sent to indicate CB decoding outcomes in comparison to non-compressed (or uncompressed) messages.

In some embodiments, a different compression codebook may be used per feedback group, such as per portion of a symbol, per symbol, or per group of symbols, based at least in part on current probabilities of successful decoding "p" for the CBs in the symbol, or group of symbols.

Figure 5:
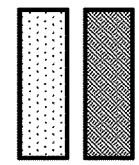
FIG. 5 is a table illustrating example codebooks and resulting distortions for code block feedback in accordance with various embodiments.

FIG. 5 is a table illustrating example codebooks and resulting distortions for code block feedback in accordance with various embodiments. With reference to FIGS. 1-5, an example of three CBs of feedback where N=3 is illustrated. Per symbol transmission, one or more of the three CBs may either be successfully decoded as indicated by a value "0" (e.g., an ACK condition) or decoding may fail as represented by a value "1" (e.g., a NACK condition). As such, the non-compressed feedback message for the various states may have eight possible feedback bitmap values "000", "001", "010", "011", "100", "101", "110", and "111". The position in the feedback bitmap may correspond to the decoding success or failure state of an assigned CB, such as the first position (e.g., far left) indicating the state of the first CB, the second position (e.g., middle) indicating the state of the second CB, and the third position (e.g., far right) indicating the state of the third CB. As examples, "000" in the feedback bitmap value of the non-compressed feedback message may indicate decoding succeeded for all three CBs, "111" in the feedback bitmap value of the non-compressed feedback message may indicate decoding failed for all three CBs, and "101" in the feedback bitmap value of the non-compressed feedback message may indicate decoding failed for the first and third CB, but succeeded for the second CB.

In various embodiments, the number of CBs to feedback "N", the value of the number of waveforms to be used for feedback "K", and the probabilities of successful decoding "p0 . . . pN−1" may be known to both the sending device (e.g., the base station 110a-110d, 350 and/or the wireless device 120a-120e, 200, 320) and the receiving device (e.g., the base station 110a-110d, 350 and/or the wireless device 120a-120e, 200, 320). FIG. 5 illustrates an example in which the N=3 (e.g., 3 CBs feedback), probabilities of successful decoding the first CB and the second CB are the same at p0=p0=0.3 and the probability of successful decoding the third CB is p3=0.7. FIG. 5 also illustrates resulting codebooks A, B, C, D, E, F, and G for different K values, K=8, K=7, K=6, K=5, K=4, K=3, and K=2.

FIG. 5 illustrates the message probability of any of the non-compressed feedback bitmaps occurring. As examples, the message probability of "000" occurring is 0.063 (e.g., 0.3×0.3.×0.7=0.063), the message probability of "001" is 0.027 (e.g., 0.3×0.3×0.3=0.027), the message probability of "010" is 0.147 (e.g., 0.3×0.7×0.7=0.147), the message probability of "110" is 0.343 (e.g., 0.7×0.7×0.7=0.343), and the message probability of "111" is 0.147 (e.g., 0.7×0.7× 0.3=0.147).

In various embodiments, a compression codebook for a given number of CBs to feedback "N", a given of the number of waveforms to be used for feedback "K", and given probabilities of successful decoding "p0 . . . pN−1" may be found by searching the available codebooks for a compression codebook having a lowest rate distortion measure "D". In some embodiments, the available codebooks may be all codebooks available to the device. In some embodiments, the available codebooks may be a group of allowed codebooks signaled from the sending device to the receiving device. As examples, the group of allowed codebooks may be signaled to the receiving device by the sending device via one or more RRC messages or one or more MAC-CE messages. In some embodiments, the available codebooks may be a single codebook dynamically signaled to the receiving device by the sending device for use with a specific number of CBs to feedback "N", a specific number of waveforms to be used for feedback "K", and specific probabilities of successful decoding "p0 . . . pN−1". As an example, the dynamically signaled codebook may be indicated to the receiving device by the sending device in overhead information.

FIG. 5 further illustrates example codebooks A, B, C, D, E, F, and G selected for the corresponding K values, 8, 7, 6, 5, 4, 3, and 2. Codebook A may be an uncompressed codebook in which no distortion occurs as eight bits of feedback may be sufficient to fully send the non-compressed message. Codebooks B-G may represent compressed codebooks in which at least one of the feedback bitmaps of the non-compressed message is substituted with a replacement feedback bitmap. The replacement of the feedback bitmap with a replacement feedback bitmap may result in compression of the feedback data as less than eight bits may be used for Re-Tx signaling. For example, codebook B may be a compression codebook used when K=7 and may substitute the non-compressed feedback bitmap "001" with the replacement feedback bitmap "101" such that only seven bits are needed for Re-Tx signaling. Such replacement in codebook B may result in a single excess Re-Tx that contributes to the rate distortion measurement "D", which may be 0.027 for K=7. As another example, codebook C may be a compression codebook used when K=6 and may substitute the non-compressed feedback bitmap "001" with the replacement feedback bitmap "101" and the non-compressed feedback bitmap "011" with the replacement feedback 111, such that only six bits are needed for Re-Tx signaling. Such replacement in codebook C may result in a two single excess Re-Tx that contribute to the rate distortion measurement "D", which may be 0.09 for K=6 (e.g., 0.27+ 0.063=0.09). As another example, codebook G may be a compression codebook used when K=2 and may substitute the non-compressed feedback bitmaps "000", "010", and "100" with the replacement feedback bitmap "110" and the feedback bitmaps "001", "011", and "101" with replacement feedback bitmap "111". In this manner, only two bits are needed for Re-Tx signaling, such that log 2(2)=1 bit of feedback, e.g., "0" is signaling uncompressed "110" and "1" is signaling uncompressed "111". Such a replacement in codebook G may result in four single excess Re-Tx scenarios and two double excess re-Tx scenarios that contributes to the rate distortion measurement "D", which may be 0.6 for K=2. In the case of K=2, the single ACK (equivalent to codebook of "000" and "111", i.e., a codebook other than codebook G) may not be suitable for K=2, though a different codebook may become suitable on a next Re-Tx where failure probabilities may decrease. As such, the compression codebook may change on the next Re-Tx cycle.

In various embodiments, a gap-to-capacity number of units may be determined, and/or signaled to, a sending device (e.g., the base station 110a-110d, 350 and/or the wireless device 120a-120e, 200, 320). In various embodiments, a gap-to-capacity number of units of a certain CB may be the size of the redundancy bits that needs to be sent in next transmissions to ensure decoding of that CB. Determining or signaling the gap-to-capacity number of units may enable the sending device to adjust the size of the Re-Tx (e.g., increase the number of redundancy bits used in the next Re-Tx cycle), and thereby possibly reduce the latency due to requiring less Re-Tx. The gap-to-capacity number of units may be the number of Re-Tx cycles needed to result in successful decoding of an ACK indicated CB in the same slot. In this manner, rather than incrementing the MCS a single level in the next Re-Tx cycle, the sending device may skip to the coding rate that resulted in successful decoding of an ACK indicated CB in the same slot. In some embodiments, in response to all CBs in a slot being NACK indicated, gap-to-capacity number of units may be explicitly indicated. The gap-to-capacity number of units may be indicated once per slot for one CB, resulting in the required overhead in transmission to indicate gap-to-capacity number of units being almost negligible. As an example, the last report in an allocation/slot may be used as an extended codebook where the extension indicates the gap to capacity. As another example, the feedback bitmap "111" as illustrated in FIG. 5 may be extended to "111-1" to indicated gap-to-capacity is one unit, "111-2" to indicate gap-to-capacity is two units, etc., where the unit signals a lowest granularity of adding redundancy bits in the MIRS scheme.

In some embodiments, a feedback rank indication may be sent per slot or allocation. As an example, the last report in an allocation/slot may be used as an extended codebook where the extension indicates the feedback rank. The feedback rank indication may be per slot or allocation and need not be associated with a TB.

Figure 6:
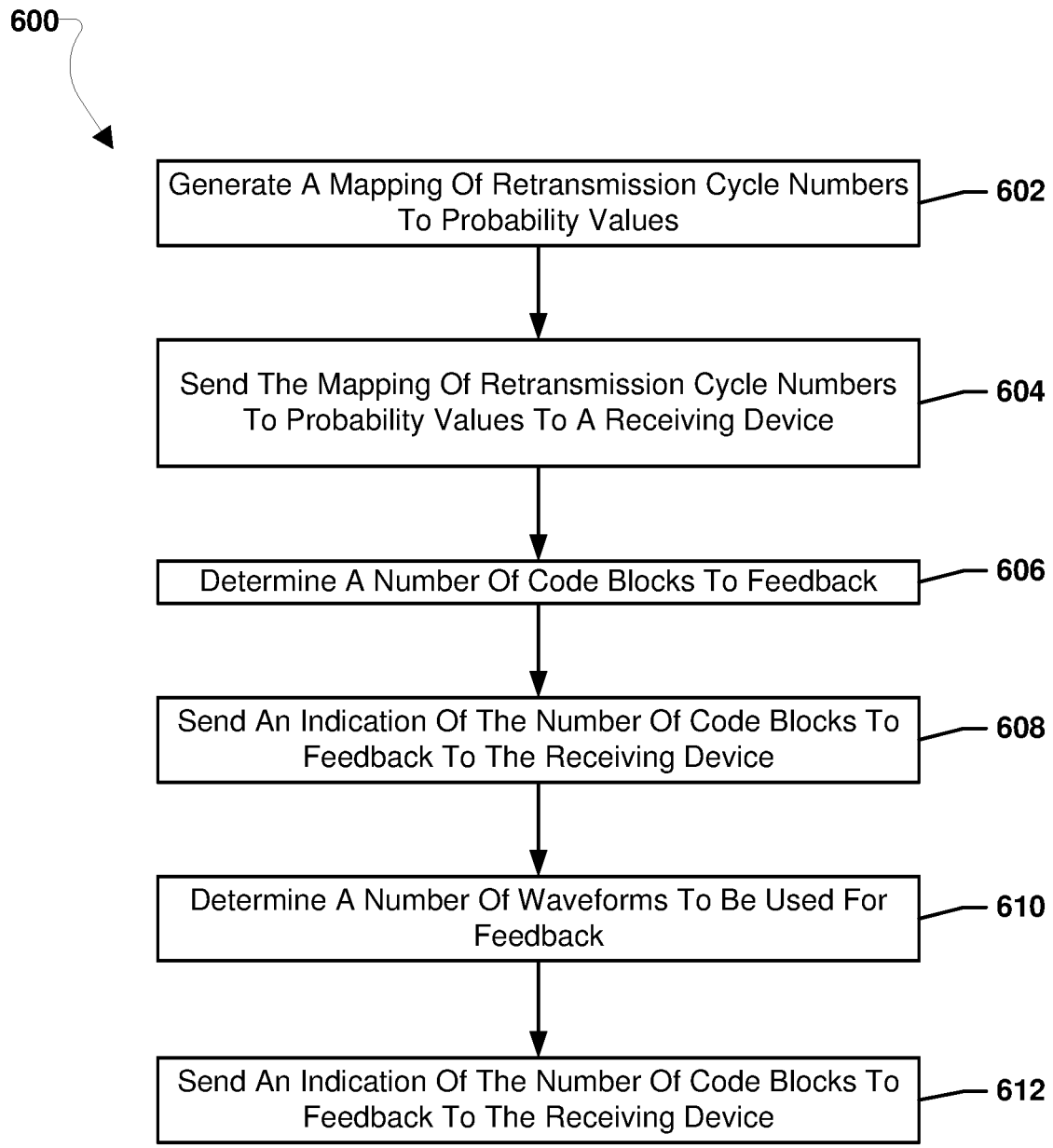
FIG. 6 is a process flow diagram illustrating a method for supporting lossy compression feedback in wireless communication retransmissions in accordance with various embodiments.

FIG. 6 is a process flow diagram illustrating a method 600 for supporting lossy compression feedback in wireless communication retransmissions in accordance with various embodiments. With reference to FIGS. 1-6, the method 600 may be performed by a processor (e.g., 210, 212, 214, 216, 218, 252, 260) of a sending device (e.g., the base station 110a-110d, 350 and/or the wireless device 120a-120e, 200, 320). With reference to FIGS. 1-6, means for performing each of the operations of the method 600 may be one or more processors of a sending device (e.g., the base station 110a-110d, 350 and/or the wireless device 120a-120e, 200, 320), such as one or more of the processors 210, 212, 214, 216, 218, 252, 260.

In block 602, the processor may perform operations including generating a mapping of retransmission cycle numbers to probability values. For example, the processor may determine probabilities of successfully decoding "p" for various different Re-Tx cycles based at least in part on one or more factors including, the number of the re-Tx cycle, an existence of spurs and/or notches in frequency and/or time, a proximity of a DMRS, a current estimated SNR, a current number of MIMO layers, etc. As an example, the mapping may be generated as a LUT correlating successive Re-Tx cycle numbers with respective probability values.

In block 604, the processor may perform operations including sending the mapping of retransmission cycle numbers to probability values to a receiving device. As examples, the mapping may be sent in one or more messages sent from a sending device to a receiving device, such as RRC messages, MAC-CE messages, etc. As specific examples, the mapping may be sent as a LUT to a receiving device in one or more RRC messages, in one or more MAC-CE messages, etc.

In block 606, the processor may perform operations including determining a number of code blocks (CBs) to feedback "N". In some embodiments, a number of CBs to feedback "N" may be pre-configured by the processor. In some embodiments, the number of CBs to feedback "N" may be determined by a sending device based on receiving device advertised capabilities. For example, a receiving device may advertise that the receiving device is enabled with lossy compression and dynamic codebook capability, and in response to the advertised capabilities the processor may determine the number of CBs to feedback "N".

In block 608, the processor may perform operations including sending an indication of the number of code blocks (CBs) to feedback "N" to the receiving device. As an example, the number of CBs to feedback "N" may be sent in one or more messages sent from a sending device to a receiving device, such as RRC messages, as MAC-CE messages, etc.

In block 610, the processor may perform operations including determining a number of waveforms to be used for feedback "K". In some embodiments, a number of waveforms to be used for feedback "K" may be pre-configured by the processor. In some embodiments, the number of waveforms to be used for feedback "K" may be determined based on receiving device advertised capabilities. For example, a receiving device may advertise that the receiving device is enabled with lossy compression and dynamic codebook capability, and in response to the advertised capabilities the processor device may determine the number of waveforms to be used for feedback "K".

In block 612, the processor may perform operations including sending an indication of the number of waveforms to be used for feedback "K" to the receiving device. As an example, the number of waveforms to be used for feedback "K" may be sent in one or more messages sent from a sending device to a receiving device, such as RRC messages, as MAC-CE messages, etc.

Figure 7:
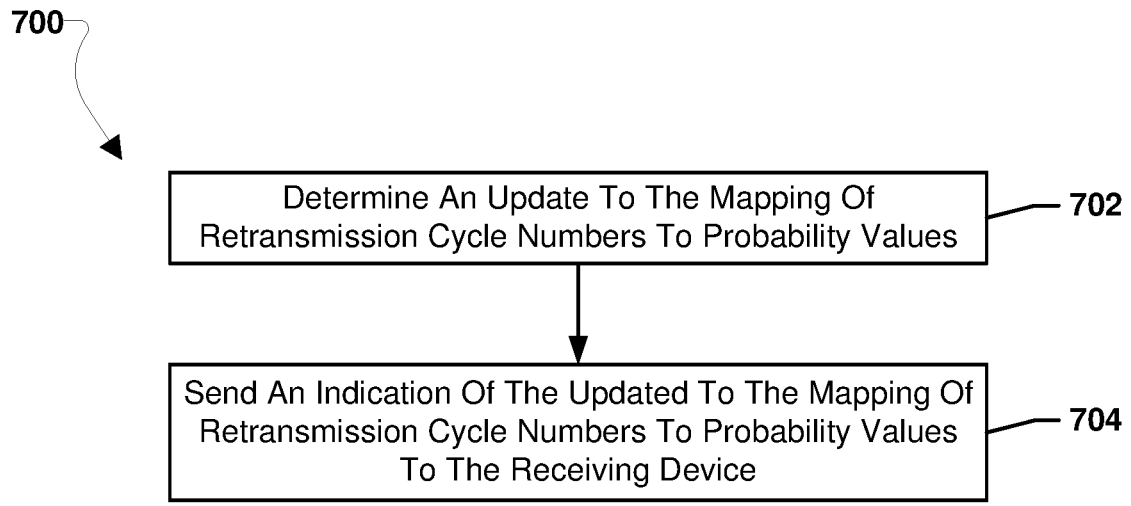
FIG. 7 is a process flow diagram illustrating a method for supporting lossy compression feedback in wireless communication retransmissions in accordance with various embodiments.

FIG. 7 is a process flow diagram illustrating a method 700 for supporting lossy compression feedback in wireless communication retransmissions in accordance with various embodiments. With reference to FIGS. 1-7, the method 700 may be performed by a processor (e.g., 210, 212, 214, 216, 218, 252, 260) of a sending device (e.g., the base station 110a-110d, 350 and/or the wireless device 120a-120e, 200, 320). With reference to FIGS. 1-7, means for performing each of the operations of the method 700 may be one or more processors of a sending device (e.g., the base station 110a-110d, 350 and/or the wireless device 120a-120e, 200, 320), such as one or more of the processors 210, 212, 214, 216, 218, 252, 260. In various embodiments, the operations of the method 700 may be performed in conjunction with the operations of the method 600 (FIG. 6).

In block 702, the processor may perform operations including determining an update to the mapping of retransmission cycle numbers to probability values. In some embodiments, the mapping of Re-Tx cycle numbers to probability values may be updated (or adapted) based on one or more dynamic parameters observed by the processor, such as channel response, mappings of various code blocks, etc. For example, values in a LUT in which Re-Tx cycle numbers are correlated with probabilities of successful decoding "p" may be updated based on the one or more dynamic parameters observed by the processor, such as channel response, mappings of various code blocks, etc. In some embodiments, the mapping of Re-Tx cycle numbers to probability values may be updated (or adapted) based on adaptation rules available to the processor. The adaptation rules may govern how probabilities of successful decoding "p" in the pre-defined mapping of Re-Tx cycle numbers to probability values may be changed based on observed conditions. As an example, an adaptation rule may indicate that if a CB is observed to fall on a spur location in frequency, the probability values for that CB may be decreased. As another example, an adaptation rule may indicate that if a CB is far from DMRSs, the probability values for that CB may be decreased.

In block 704, the processor may perform operations including sending an indication of the update to the mapping of retransmission cycle numbers to probability values to the receiving device. For example, the processor may signal the updated values per allocation in the DCI.

Figure 8:
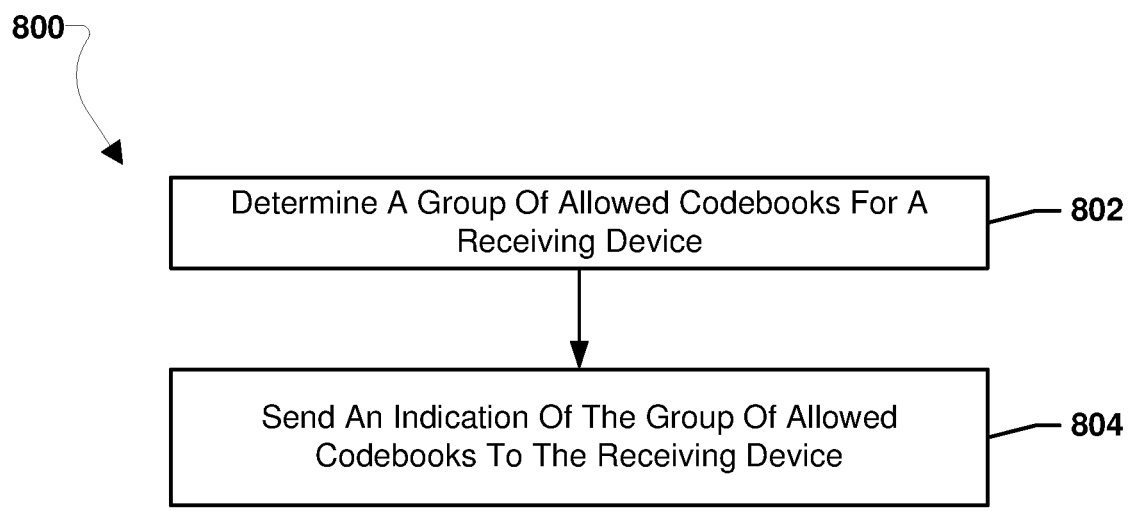
FIG. 8 is a process flow diagram illustrating a method for supporting lossy compression feedback in wireless communication retransmissions in accordance with various embodiments.

FIG. 8 is a process flow diagram illustrating a method 800 for supporting lossy compression feedback in wireless communication retransmissions in accordance with various embodiments. With reference to FIGS. 1-8, the method 800 may be performed by a processor (e.g., 210, 212, 214, 216, 218, 252, 260) of a sending device (e.g., the base station 110a-110d, 350 and/or the wireless device 120a-120e, 200, 320). With reference to FIGS. 1-8, means for performing each of the operations of the method 800 may be one or more processors of a sending device (e.g., the base station 110a-110d, 350 and/or the wireless device 120a-120e, 200, 320), such as one or more of the processors 210, 212, 214, 216, 218, 252, 260. In various embodiments, the operations of the method 800 may be performed in conjunction with the operations of the method 600 (FIG. 6) and/or the method 700 (FIG. 7).

In block 802, the processor may perform operations including determining group of allowed codebooks for a receiving device. The allowed codebooks may be determined on various parameters observed and/or determined by the processor and/or signaled by the receiving device, such as channel response, mappings of various code blocks, a number of CBs to feedback "N", a number of waveforms to be used for feedback "K", probabilities of successful decoding "p0 . . . pN−1", etc. The allowed codebooks may be a single codebook, two or more codebooks, etc. The allowed codebooks may be dynamically determined by the processor.

In some embodiments, allowed codebooks may be determined based on all codebooks available to the device. For example, the group of allowed codebooks may be signaled to the receiving device by the sending device via one or more RRC messages or one or more MAC-CE messages. In some embodiments, the available codebooks may be a single codebook dynamically signaled to the receiving device by the sending device for use with a specific number of CBs to feedback "N", a specific number of waveforms to be used for feedback "K", and specific probabilities of successful decoding "p0 . . . pN−1". As an example, the dynamically signaled codebook may be indicated to the receiving device by the sending device in overhead information.

In block 804, the processor may perform operations including and sending an indication of the group of allowed codebooks to the receiving device. For example, the indication of the group of allowed codebooks may be sent in one or more messages sent from a sending device to a receiving device, such as RRC messages, as MAC-CE messages, etc. As another example, the indication of the group of allowed codebooks may be sent in overhead information.

Figure 9:
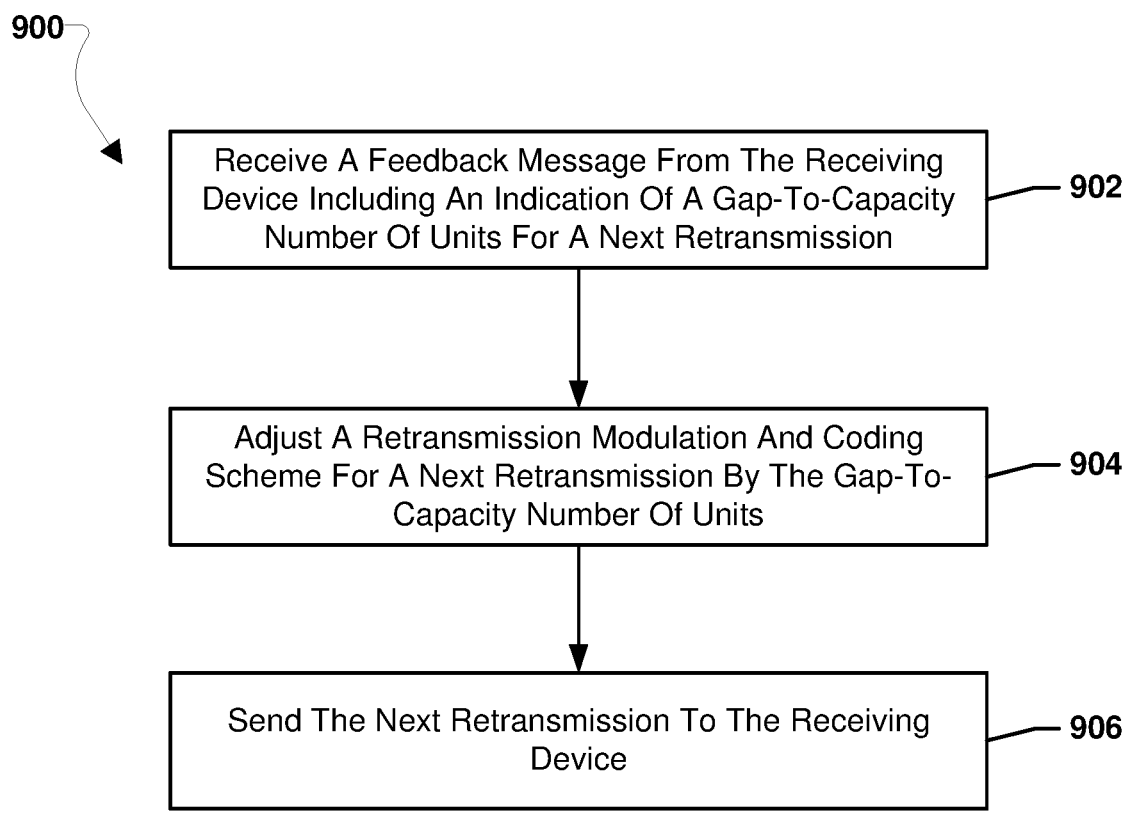
FIG. 9 is a process flow diagram illustrating a method for supporting lossy compression feedback in wireless communication retransmissions in accordance with various embodiments.

FIG. 9 is a process flow diagram illustrating a method 900 for supporting lossy compression feedback in wireless communication retransmissions in accordance with various embodiments. With reference to FIGS. 1-9, the method 900 may be performed by a processor (e.g., 210, 212, 214, 216, 218, 252, 260) of a sending device (e.g., the base station 110a-110d, 350 and/or the wireless device 120a-120e, 200,

320). With reference to FIGS. 1-9, means for performing each of the operations of the method 900 may be one or more processors of a sending device (e.g., the base station 110a-110d, 350 and/or the wireless device 120a-120e, 200, 320), such as one or more of the processors 210, 212, 214, 216, 218, 252, 260. In various embodiments, the operations of the method 900 may be performed in conjunction with the operations of the method 600 (FIG. 6), the method 700 (FIG. 7), and/or the method 800 (FIG. 8).

In block 902, the processor may perform operations including receiving a feedback message from the receiving device including an indication of a gap-to-capacity number of units for a next retransmission. In various embodiments, a gap-to-capacity number of units of a certain CB may be the size of the redundancy bits that needs to be sent in next transmissions to ensure decoding of that CB. The gap-to-capacity number of units may be the number of Re-Tx cycles needed to result in successful decoding of an ACK indicated CB in the same slot.

In block 904, the processor may perform operations including adjusting a retransmission modulation and coding scheme for a next retransmission by the gap-to-capacity number of units. The adjustment may include decreasing the coding rate for a next retransmission by a value greater than one. For example, as the gap-to-capacity number of units may be the number of Re-Tx cycles needed to result in successful decoding of a NACK indicated CB in the same slot, rather than incrementing the coding rate a single level in the next Re-Tx cycle, the processor may adjust the retransmission size to skip to the coding rate that resulted in successful decoding of a NACK indicated CB in the same slot.

In block 906, the processor may perform operations including sending the next retransmission to the receiving device. The next retransmission may be sent according to the retransmission system being implemented by the processor, such as HARQ protocols, MIRS, etc.

Figure 10:
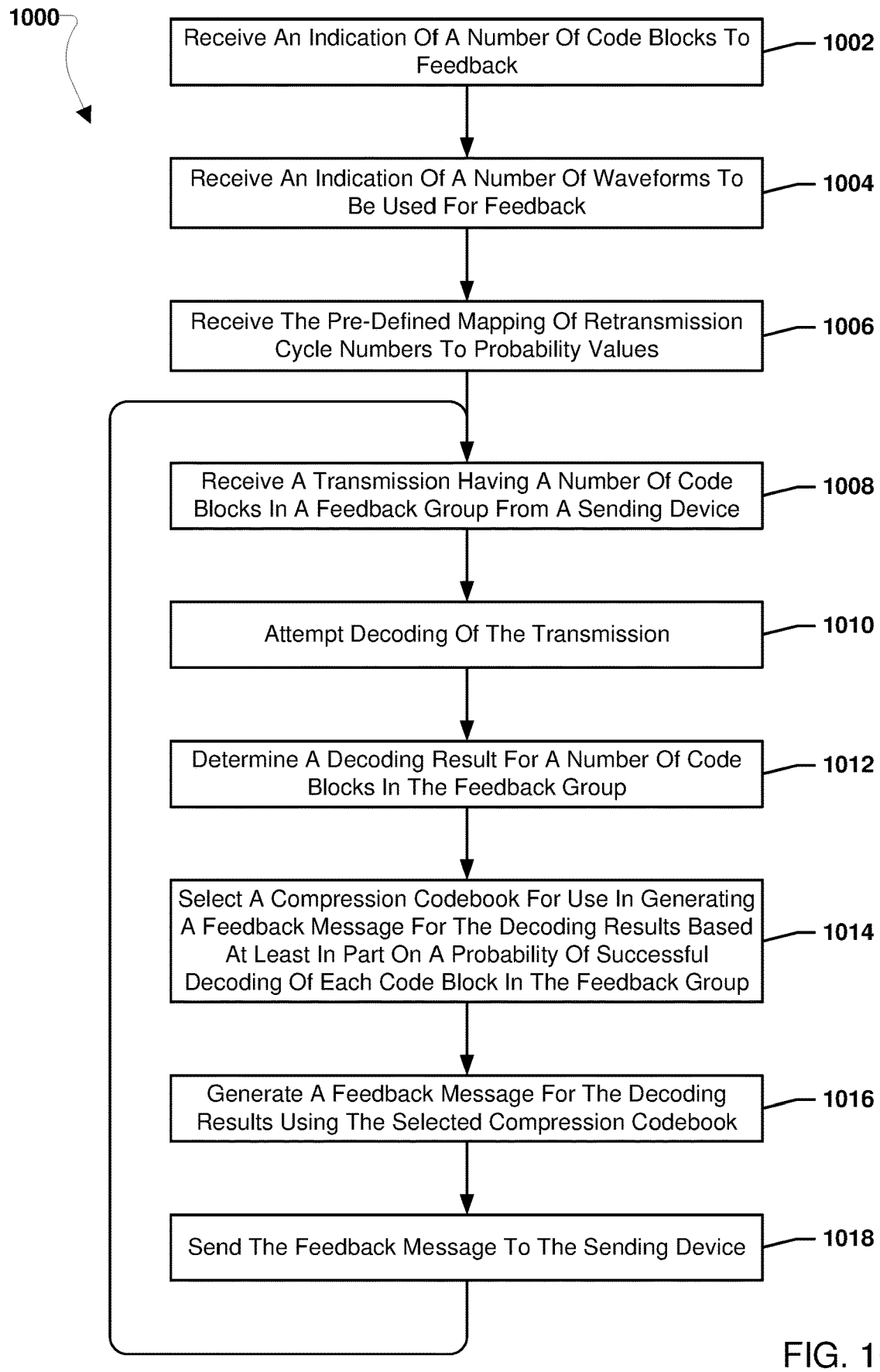
FIG. 10 is a process flow diagram illustrating a method for supporting lossy compression feedback in wireless communication retransmissions in accordance with various embodiments.

FIG. 10 is a process flow diagram illustrating a method 1000 for supporting lossy compression feedback in wireless communication retransmissions in accordance with various embodiments. With reference to FIGS. 1-10, the method 1000 may be performed by a processor of a receiving device (e.g., the base station 110a-110d, 350 and/or the wireless device 120a-120e, 200, 320). With reference to FIGS. 1-10, means for performing each of the operations of the method 1000 may be one or more processors of a receiving device (e.g., the base station 110a-110d, 350 and/or the wireless device 120a-120e, 200, 320), such as one or more of the processors 210, 212, 214, 216, 218, 252, 260. In various embodiments, the operations of the method 1000 may be performed in conjunction with the operations of the method 600 (FIG. 6), the method 700 (FIG. 7), the method 800 (FIG. 8), and/or the method 900 (FIG. 9).

In block 1002, the processor may perform operations including receiving an indication of a number of code blocks (CBs) to feedback "N". As an example, the number of CBs to feedback "N" may be received in one or more messages received by a receiving device from a sending device, such as RRC messages, as MAC-CE messages, etc.

In block 1004, the processor may perform operations including receiving an indication of a number of waveforms "K" to be used for feedback. As an example, the number of waveforms to be used for feedback "K" may be received in one or more messages received by a receiving device from a sending device, such as RRC messages, as MAC-CE messages, etc.

In block 1006, the processor may perform operations including receiving a pre-defined mapping of retransmission cycle numbers to probability values. As examples, the mapping may be received in one or more messages received by a receiving device from a sending device, such as RRC messages, as MAC-CE messages, etc. As specific examples, the mapping may be received as a LUT from a sending device in one or more RRC messages, in one or more MAC-CE messages, etc.

In block 1008, the processor may perform operations including receiving a transmission having a number of code blocks in a feedback group from a sending device. As an example, the processor may perform operations including receiving a transmission having a number of code blocks in a symbol from a sending device. As an example, the processor may perform operations including receiving a transmission having a number of code blocks in a portion of a symbol from a sending device. As another example, the processor may perform operations including receiving a transmission having a number of code blocks in a group of symbols from a sending device.

In block 1010, the processor may perform operations including attempting decoding of the transmission. A decoding attempt may include computation of logarithm likelihood ratios (LLRs) for different bit positions of a CB. The LLRs may be used to generate decoded data bits. The decoding attempt also may include computation of an error checking value that can be compared with error checking information embedded in the CB. A CB is successfully decoded when the processor can verify that the computed error checking value matches the error checking information embedded in the CB. In some implementations, the processor may attempt to use error correction to correct bit errors and compute another error checking value.

In block 1012, the processor may perform operations including determining a decoding result for a number of code blocks (CBs) in the feedback group. The receiving device may determine that it has failed to decode a CB if the receiving device cannot verify the error checking value. A success or failure to decode a CB may be referred to as a decoding result. Successful decoding of a CB may be associated with an acknowledgement (ACK) condition, for example indicated by a bit value of "0" in feedback message. Failure to decode (or unsuccessful decoding of) a CB may be associated with a negative acknowledgement (NACK) condition, for example indicated by a bit value of "1" in a feedback message.

In block 1014, the processor may perform operations including selecting a compression codebook for use in generating a feedback message for the decoding results based at least in part on a probability of successful decoding of each code block in the feedback group. In some embodiments, a compression codebook may include feedback bitmaps for less than all possible combinations of CB decoding outcomes of the feedback group, such as the portion of the symbol, the symbol, or the group of symbols. In some embodiments, a compression codebook may be selected to generate feedback bitmaps for less than all possible combinations of CB decoding outcomes of the feedback group, such as the portion of the symbol, the symbol, or the group of symbols, thereby reducing an amount of feedback data sent to indicate CB decoding outcomes in comparison to non-compressed (or uncompressed) messages. In some embodiments, selecting the compression codebook for use in generating the feedback message for the decoding results may be based at least in part on the probability of successful decoding of each code block in the feedback group, the number of code blocks to feedback, and the number of waveforms to be used for feedback. In some embodiments, a different compression codebook may be used per feedback group, such as per portion of a symbol, per symbol, or per group of symbols, based at least in part on current probabilities of successful decoding "p" for the CBs in the symbol, or group of symbols.

In block 1016, the processor may perform operations including generating a feedback message for the decoding results using the selected compression codebook. Generating the feedback message may include generating feedback in accordance to the selected codebook (which includes feedback messages for less than all possible combinations of CB decoding outcomes of the feedback group). The generated feedback message may include an indication of the decoding results for the feedback group, such as the decoding results for the portion of the symbol, the decoding results for the symbol, or the decoding results for the group of symbols. The feedback message may include a feedback bitmap representing whether CBs in the feedback group, such as the portion of the symbol, the symbol, or the group of symbols, were successfully decoded. For example, bit positions in the feedback bitmap of a value "0" may indicate an ACK condition representing successful decoding of the CB associated with that bit position, and bit positions in the feedback bitmap of a value "1" may indicate a NACK condition representing decoding failure of the CB associated with that bit position. The generated feedback message may include feedback bitmaps for less than all possible combinations of CB decoding outcomes of the feedback group. In some embodiments, the feedback message may include a feedback rank indication. A feedback rank indication may be sent per slot or allocation. As an example, the last report in an allocation/slot may be used as an extended codebook where the extension indicates the feedback rank. The feedback rank indication may be per slot or allocation and need not be associated with a TB.

In block 1018, the processor may perform operations including sending the feedback message to the sending device. For example, the feedback message may be sent to the sending device according to the retransmission system being implemented by the processor, such as HARQ protocols, MIRS, etc.

In response to sending the feedback message the processor may perform the operations in block 1008 to receive a next transmission as described. The operations of blocks 1008-1018 may be performed for the next feedback group on a per feedback group basis to select a different compression codebook, generate a feedback message using the different compression codebook, and send the feedback message to the sending device.

Figure 11:
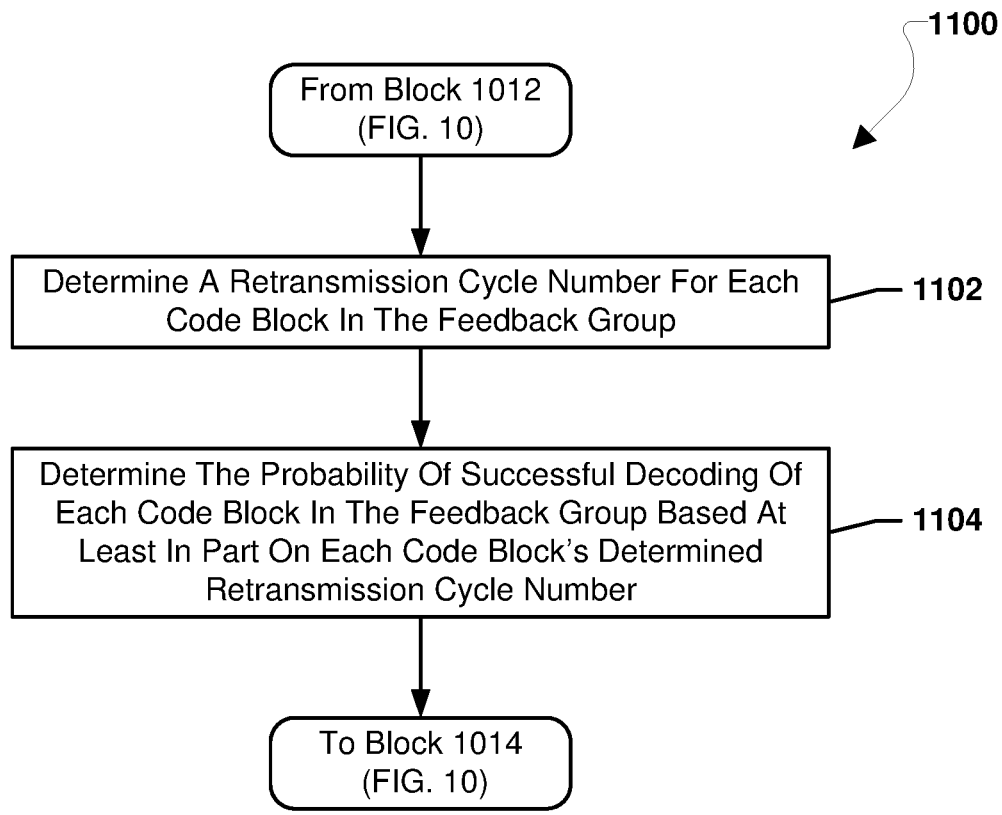
FIG. 11 is a process flow diagram illustrating a method for supporting lossy compression feedback in wireless communication retransmissions in accordance with various embodiments.

FIG. 11 is a process flow diagram illustrating a method 1100 for supporting lossy compression feedback in wireless communication retransmissions in accordance with various embodiments. With reference to FIGS. 1-11, the method 1100 may be performed by a processor of a receiving device (e.g., the base station 110a-110d, 350 and/or the wireless device 120a-120e, 200, 320). With reference to FIGS. 1-11, means for performing each of the operations of the method 1100 may be one or more processors of a receiving device (e.g., the base station 110a-110d, 350 and/or the wireless device 120a-120e, 200, 320), such as one or more of the processors 210, 212, 214, 216, 218, 252, 260. In various embodiments, the operations of the method 1100 may be performed in conjunction with the operations of the method 600 (FIG. 6), the method 700 (FIG. 7), the method 800 (FIG. 8), the method 900 (FIG. 9), and/or the method 1000 (FIG. 10). As a specific example, the operations of the method 1100 may be performed in response to determining a decoding result in block 1012 of the method 1000 (FIG. 10).

In block 1102, the processor may perform operations including determining a retransmission (Re-Tx) cycle number for each code block (CB) in the feedback group. The processor may track retransmission (Re-Tx) of a previously failed CB. The number of Re-Txs that have occurred for a CB may correspond to the Re-Tx cycle number.

In block 1104, the processor may perform operations including determining the probability of successful decoding "p" of each code block in the first feedback group based at least in part on each code block's determined retransmission cycle number. The probability of ACK or NACK per CB may be represented by a probability of successful decoding "p". The probability of successful decoding "p" may represent the probability that a CB is successfully decoded. The probability of successful decoding "p" may be based at least in part on one or more factors including, the number of re-Tx cycles of that CB, an existence of spurs and/or notches in frequency and/or time, a proximity of a DMRS, a current estimated SNR, a current number of MIMO layers, etc. In some embodiments, the probability of successful decoding "p" of each CB in the feedback group may be determined as a probability value correlated with that code block's retransmission cycle number in a pre-defined mapping of retransmission cycle numbers to probability values.

In response to determining the probability of successful decoding in block 1104, the method 1100 may proceed perform the operations in block 1014 of the method 1000 (FIG. 10) as described.

Figure 12:
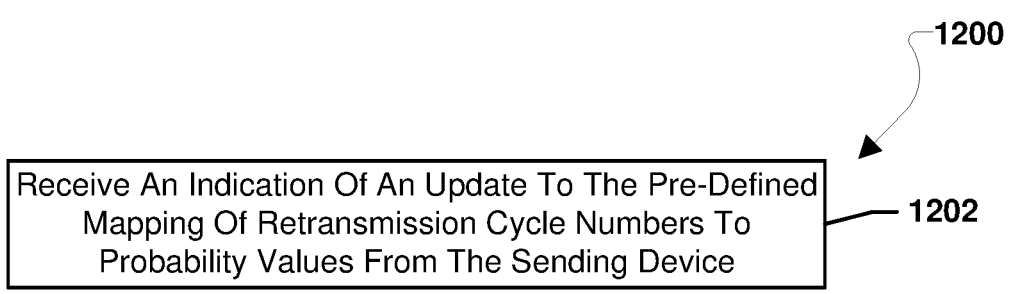
FIG. 12 is a process flow diagram illustrating a method for supporting lossy compression feedback in wireless communication retransmissions in accordance with various embodiments.

FIG. 12 is a process flow diagram illustrating a method 1200 for supporting lossy compression feedback in wireless communication retransmissions in accordance with various embodiments. With reference to FIGS. 1-12, the method 1200 may be performed by a processor of a receiving device (e.g., the base station 110a-110d, 350 and/or the wireless device 120a-120e, 200, 320). With reference to FIGS. 1-12, means for performing each of the operations of the method 1200 may be one or more processors of a receiving device (e.g., the base station 110a-110d, 350 and/or the wireless device 120a-120e, 200, 320), such as one or more of the processors 210, 212, 214, 216, 218, 252, 260. In various embodiments, the operations of the method 1200 may be performed in conjunction with the operations of the method 600 (FIG. 6), the method 700 (FIG. 7), the method 800 (FIG. 8), the method 900 (FIG. 9), the method 1000 (FIG. 10), and/or the method 1100 (FIG. 11).

In block 1202, the processor may perform operations including receiving an indication of an update to the pre-defined mapping of retransmission cycle numbers to probability values from the sending device. For example, the processor may receive the update to the pre-defined mapping of retransmission cycle numbers to probability values per allocation in the DCI. The update to the pre-defined mapping of retransmission cycle numbers to probability values from the sending device may be updated (or adapted) based on one or more dynamic parameters observed by the sending device, such as channel response, mappings of various code blocks, etc. For example, values in a LUT in which Re-Tx cycle numbers are correlated with probabilities of successful decoding "p" may be updated based on one or more dynamic parameters observed by the sending device. In some embodiments, the pre-defined mapping of Re-Tx cycle numbers to probability values may be updated (or adapted) based on adaptation rules available to the sending device.

The adaptation rules may govern how probabilities of successful decoding "p" in the pre-defined mapping of Re-Tx cycle numbers to probability values may be changed based on observed conditions.

Figure 13:
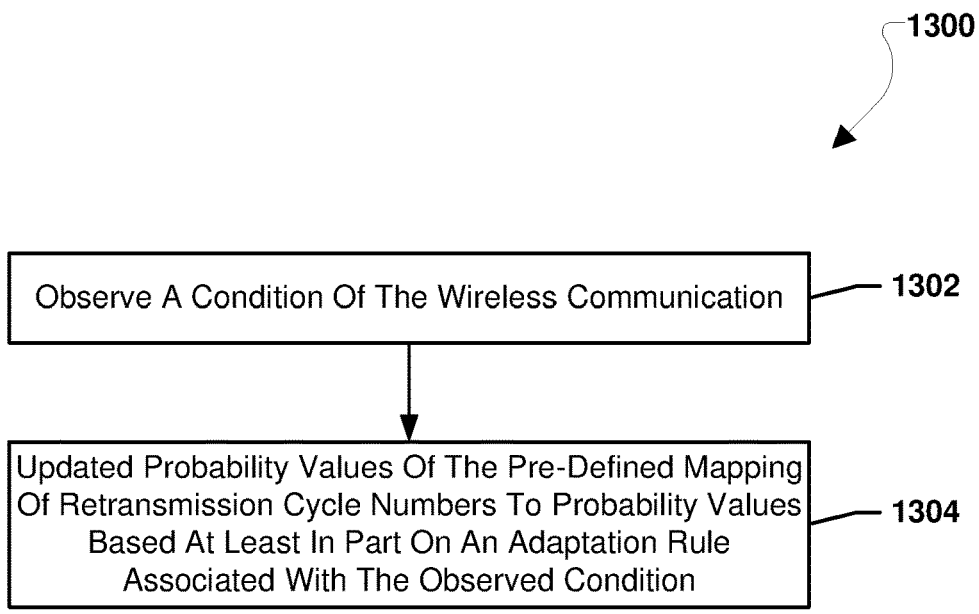
FIG. 13 is a process flow diagram illustrating a method for supporting lossy compression feedback in wireless communication retransmissions in accordance with various embodiments.

FIG. 13 is a process flow diagram illustrating a method 1300 for supporting lossy compression feedback in wireless communication retransmissions in accordance with various embodiments. With reference to FIGS. 1-13, the method 1300 may be performed by a processor of a receiving device (e.g., the base station 110a-110d, 350 and/or the wireless device 120a-120e, 200, 320). With reference to FIGS. 1-13, means for performing each of the operations of the method 1300 may be one or more processors of a receiving device (e.g., the base station 110a-110d, 350 and/or the wireless device 120a-120e, 200, 320), such as one or more of the processors 210, 212, 214, 216, 218, 252, 260. In various embodiments, the operations of the method 1300 may be performed in conjunction with the operations of the method 600 (FIG. 6), the method 700 (FIG. 7), the method 800 (FIG. 8), the method 900 (FIG. 9), the method 1000 (FIG. 10), the method 1100 (FIG. 11), and/or the method 1200 (FIG. 12).

In block 1302, the processor may perform operations including observing a condition of the wireless communication. As examples, observed conditions of the wireless communication may include one or more of spur location in frequency, CB position relative to DMRSs, channel response, and/or mappings of various code blocks.

In block 1304, the processor may perform operations including updating probability values of the pre-defined mapping of retransmission cycle numbers to probability values based at least in part on an adaptation rule associated with the observed condition. In some embodiments, the pre-defined mapping of Re-Tx cycle numbers to probability values may be updated (or adapted) based on adaptation rules available to the processor. The adaptation rules may govern how probabilities of successful decoding "p" in the pre-defined mapping of Re-Tx cycle numbers to probability values may be changed based on observed conditions. As an example, an adaptation rule may indicate that if a CB is observed to fall on a spur location in frequency, the probability values for that CB may be decreased. As another example, an adaptation rule may indicate that if a CB is far from DMRSs, the probability values for that CB may be decreased. In some embodiments, the adaptation rules may be provided by the sending device, such as in one or more RRC messages, in one or more MAC-CE messages, etc. In response to receiving adaptation rules, the processor may apply the adaptation rules to adjust the probabilities of successful decoding "p" used for various CBs based at least in part on an adaptation rule associated with the observed condition.

Figure 14:
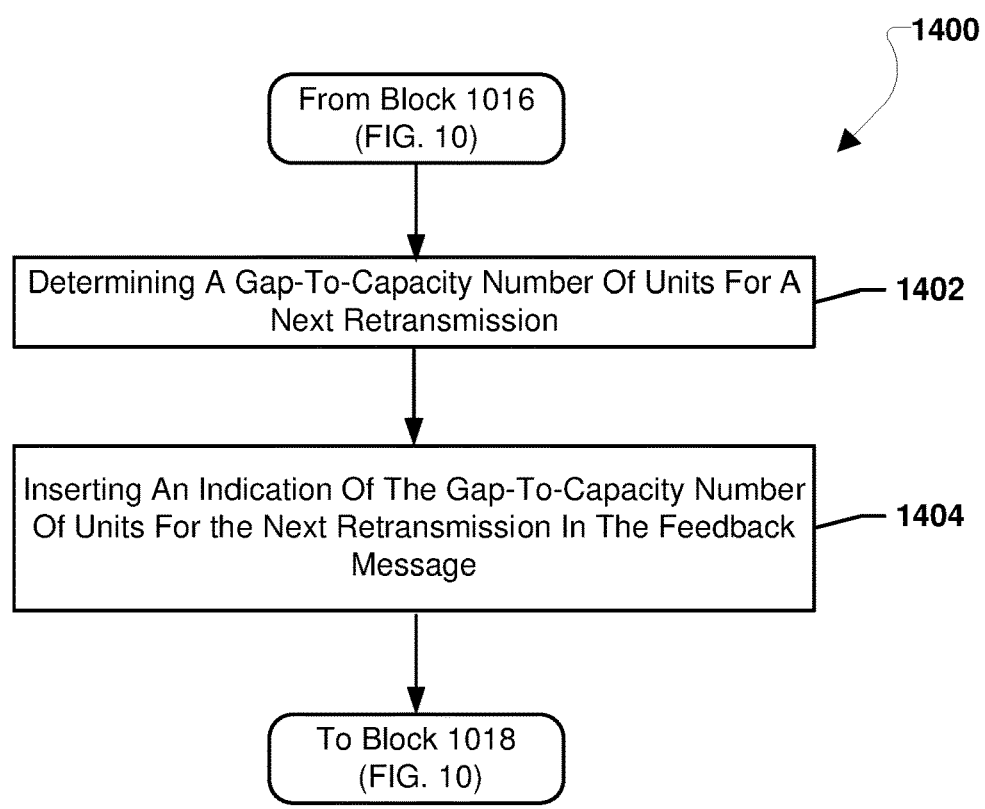
FIG. 14 is a process flow diagram illustrating a method for supporting lossy compression feedback in wireless communication retransmissions in accordance with various embodiments.

FIG. 14 is a process flow diagram illustrating a method 1400 for supporting lossy compression feedback in wireless communication retransmissions in accordance with various embodiments. With reference to FIGS. 1-14, the method 1400 may be performed by a processor of a receiving device (e.g., the base station 110a-110d, 350 and/or the wireless device 120a-120e, 200, 320). With reference to FIGS. 1-10, means for performing each of the operations of the method 1400 may be one or more processors of a receiving device (e.g., the base station 110a-110d, 350 and/or the wireless device 120a-120e, 200, 320), such as one or more of the processors 210, 212, 214, 216, 218, 252, 260. In various embodiments, the operations of the method 1400 may be performed in conjunction with the operations of the method 600 (FIG. 6), the method 700 (FIG. 7), the method 800 (FIG. 8), the method 900 (FIG. 9), the method 1000 (FIG. 10), the method 1100 (FIG. 11), the method 1200 (FIG. 12), and/or the method 1300 (FIG. 13). As an example, the operations of the method 1400 may be performed in response to determining a decoding result in block 1016 of the method 1000 (FIG. 10).

In block 1402, the processor may perform operations including determining a gap-to-capacity number of units for a next retransmission. In various embodiments, a gap-to-capacity number of units of a certain CB may be the size of the redundancy bits that needs to be sent in next transmissions to ensure decoding of that CB. The gap-to-capacity number of units may be the number of Re-Tx cycles needed to result in successful decoding of an ACK indicated CB in the same slot.

In block 1404, the processor may perform operations including inserting an indication of the gap-to-capacity number of units for the next retransmission in the feedback message. For example, the gap-to-capacity number of units for the next retransmission may be indicated as a value in a feedback message to be sent to the sending device according to the retransmission system being implemented by the processor, such as HARQ protocols, MIRS, etc.

In response to inserting the indication of the gap-to-capacity number of units in block 1404, the method 1400 may perform the operations in block 1018 of the method 1000 (FIG. 10) as described.

Figure 15:
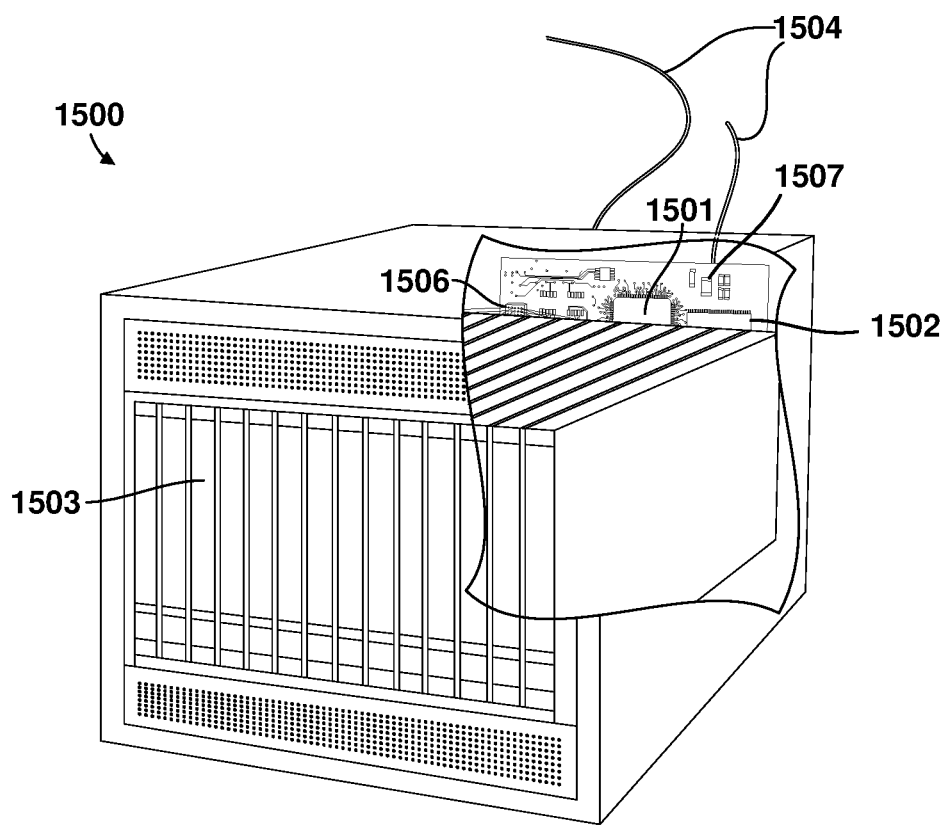
FIG. 15 is a component block diagram of a network computing device suitable for use with various embodiments.

Various embodiments may be implemented on a variety of wireless network devices, an example of which is illustrated in FIG. 15 in the form of a wireless network computing device 1500 functioning as a network element of a communication network, such as a base station (e.g., base station 110a-110d, 350, etc.). Such network computing devices may include at least the components illustrated in FIG. 15. With reference to FIGS. 1-15, the network computing device 1500 may typically include a processor 1501 coupled to volatile memory 1502 and a large capacity nonvolatile memory, such as a disk drive 1503. The network computing device 1500 may also include a peripheral memory access device, such as a floppy disc drive, compact disc (CD) or digital video disc (DVD) drive 1506 coupled to the processor 1501. The network computing device 1500 may also include network access ports 1504 (or interfaces) coupled to the processor 1501 for establishing data connections with a network, such as the Internet and/or a local area network coupled to other system computers and servers. The network computing device 1500 may include one or more antennas 1507 for sending and receiving electromagnetic radiation that may be connected to a wireless communication link. The network computing device 1500 may include additional access ports, such as USB, Firewire, Thunderbolt, and the like for coupling to peripherals, external memory, or other devices.

Figure 16:
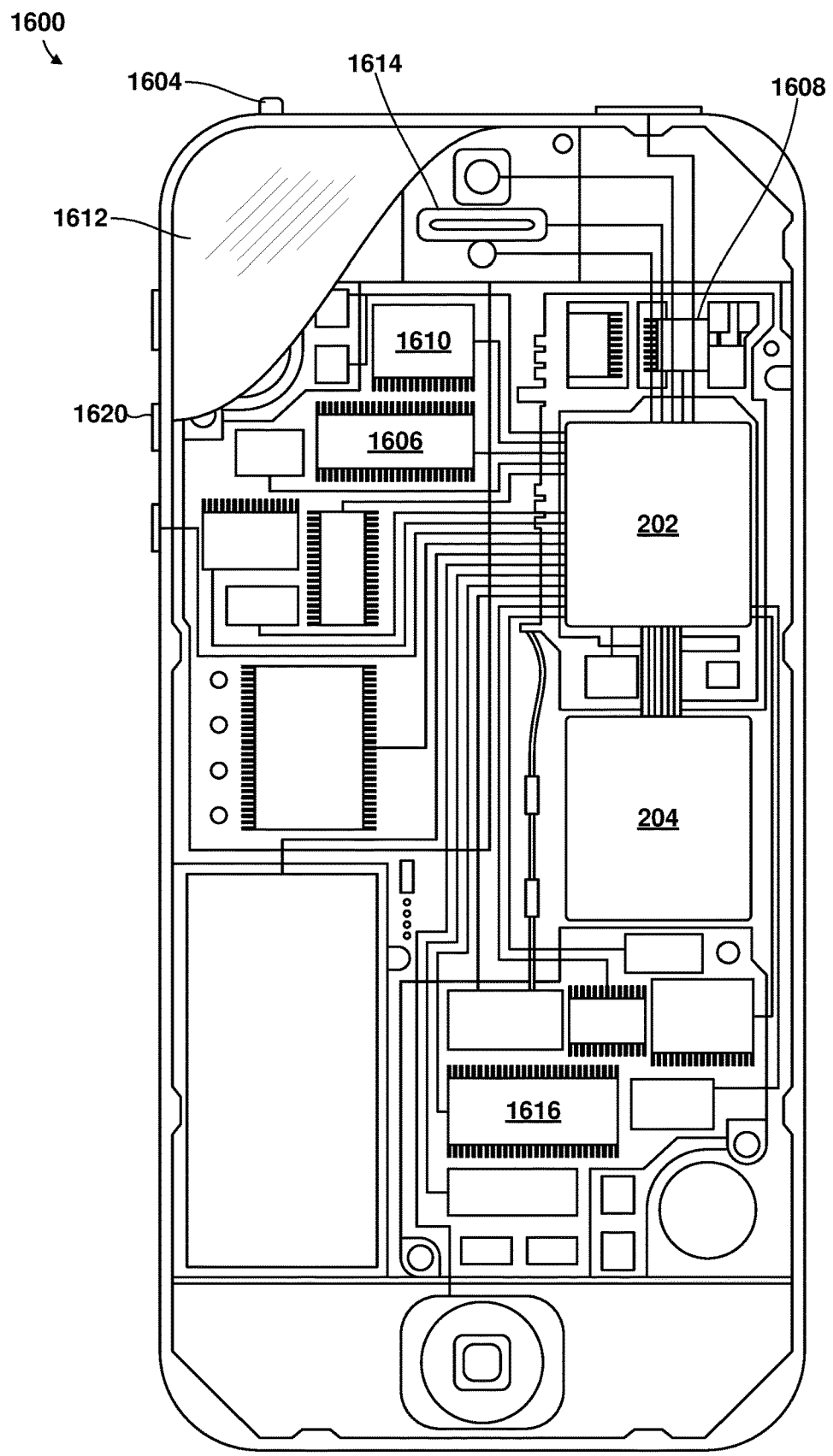
FIG. 16 is a component block diagram of a wireless device suitable for use with various embodiments.

Various embodiments may be implemented on a variety of wireless devices (e.g., the wireless device 120a-120e, 200, 320), an example of which is illustrated in FIG. 16 in the form of a smartphone 1600. With reference to FIGS. 1-16, the smartphone 1600 may include a first SOC 202 (e.g., a SOC-CPU) coupled to a second SOC 204 (e.g., a 5G capable SOC). The first and second SOCs 202, 204 may be coupled to internal memory 1606, 1616, a display 1612, and to a speaker 1614. Additionally, the smartphone 1600 may include an antenna 1604 for sending and receiving electromagnetic radiation that may be connected to a wireless data link and/or cellular telephone transceiver 1608 coupled to one or more processors in the first and/or second SOCs 202, 204. Smartphones 1600 typically also include menu selection buttons or rocker switches 1620 for receiving user inputs.

A typical smartphone 1600 also includes a sound encoding/decoding (CODEC) circuit 1610, which digitizes sound received from a microphone into data packets suitable for wireless transmission and decodes received sound data packets to generate analog signals that are provided to the speaker to generate sound. Also, one or more of the processors in the first and second SOCs 202, 204, wireless transceiver 1608 and CODEC circuit 1610 may include a digital signal processor (DSP) circuit (not shown separately).

The processors of the wireless network computing device 1500 and the smart phone 1600 may be any programmable microprocessor, microcomputer or multiple processor chip or chips that can be configured by software instructions (applications) to perform a variety of functions, including the functions of the various embodiments described below. In some mobile devices, multiple processors may be provided, such as one processor within an SOC 204 dedicated to wireless communication functions and one processor within an SOC 202 dedicated to running other applications. Typically, software applications may be stored in the memory 1606, 1616 before they are accessed and loaded into the processor. The processors may include internal memory sufficient to store the application software instructions.

Implementation examples are described in the following paragraphs. While some of the following implementation examples are described in terms of example methods, further example implementations may include: the example methods discussed in the following paragraphs implemented by a wireless device (either a sending device or a receiving device) including a processor configured with processor-executable instructions to perform operations of the methods of the following implementation examples; the example methods discussed in the following paragraphs implemented by a wireless device (either a sending device or a receiving device) including means for performing functions of the methods of the following implementation examples; and the example methods discussed in the following paragraphs may be implemented as a non-transitory processor-readable storage medium having stored thereon processor-executable instructions configured to cause a processor of a wireless device (either a sending device or a receiving device) to perform operations of the methods of the following implementation examples.

Example 1. A method for supporting lossy compression feedback in wireless communication retransmissions performed by a processor of a receiving wireless device, including: determining first decoding results for a number of code blocks in a first feedback group received from a sending device; selecting a first compression codebook for use in generating a feedback message for the first decoding results based at least in part on a probability of successful decoding of each code block in the first feedback group; generating a first feedback message for the first decoding results using the selected first compression codebook; and sending the first feedback message to the sending device.

Example 2. The method of example 1, further including: determining second decoding results for a number of code blocks in a second feedback group received from the sending device; selecting a second compression codebook for use in generating a feedback message for the second decoding results based at least in part on a probability of successful decoding of each code block in the second feedback group; generating a second feedback message for the second decoding results using the selected second compression codebook; and sending the second feedback message to the sending device.

Example 3. The method of example 2, in which the first feedback group is a first symbol received from the sending device and the second feedback group is a second symbol received from the sending device.

Example 4. The method of any of examples 1-3, further including: determining a retransmission cycle number for each code block in the first feedback group; and determining the probability of successful decoding of each code block in the first feedback group based at least in part on each code block's determined retransmission cycle number.

Example 5. The method of example 4, in which determining the probability of successful decoding of each code block in the first feedback group based at least in part on each code block's determined retransmission cycle number includes determining the probability of successful decoding of each code block in the first feedback group as a probability value correlated with that code block's retransmission cycle number in a pre-defined mapping of retransmission cycle numbers to probability values.

Example 6. The method of example 5, further including: receiving from the sending device: an indication of a number of code blocks to feedback; an indication of a number of waveforms to be used for feedback; and the pre-defined mapping of retransmission cycle numbers to probability values, in which selecting the first compression codebook for use in generating the feedback message for the first decoding results based at least in part on the probability of successful decoding of each code block in the first feedback group includes selecting the first compression codebook for use in generating the feedback message for the first decoding results based at least in part on the probability of successful decoding of each code block in the first feedback group, the number of code blocks to feedback, and the number of waveforms to be used for feedback.

Example 7. The method of example 6, further including: receiving an indication of an update to the pre-defined mapping of retransmission cycle numbers to probability values from the sending device.

Example 8. The method of example 6, further including: observing a condition of the wireless communication; and updating probability values of the pre-defined mapping of retransmission cycle numbers to probability values based at least in part on an adaptation rule associated with the observed condition of the wireless communication.

Example 9. The method of any of examples 1-8, in which the first compression codebook is selected from a group of allowed codebooks indicated by the sending device.

Example 10. The method of any of examples 1-9, in which the first compression codebook is signaled to the receiving device by the sending device.

Example 11. The method of any of examples 1-10, further including: determining a gap-to-capacity number of units for a next retransmission; and inserting an indication of the gap-to-capacity number of units for the next retransmission in the first feedback message.

Example 12. The method of any of examples 1-11, in which the first feedback message includes a feedback rank indication.

Example 13. A method for supporting lossy compression feedback in wireless communication retransmissions performed by a processor of a sending wireless device, including: generating a mapping of retransmission cycle numbers to probability values; and sending the mapping of retransmission cycle numbers to probability values to a receiving device.

Example 14. The method of any of examples 13, in which the probability values are based at least in part on a number of retransmission cycles for a code block.

Example 15. The method of example 14, in which the probability values are further based at least in part on one or more of an existence of frequency spurs, a proximity of a demodulated reference signal (DMRS), a current estimated signal-to-noise ratio (SNR), and a current number of Multiple Input Multiple Output (MIMO).

Example 16. The method of any of examples 13-15, further including: determining a number of code blocks to feedback; sending an indication of the number of code blocks to feedback to the receiving device; determining a number of waveforms to be used for feedback; and sending an indication of the number of waveforms to be used for feedback to the receiving device.

Example 17. The method of any of examples 13-16, further including: determining an update to the mapping of retransmission cycle numbers to probability values; and sending an indication of the update to the mapping of retransmission cycle numbers to probability values to the receiving device.

Example 18. The method of any of examples 13-17, further including: determining a group of allowed codebooks for a receiving device; and sending an indication of the group of allowed codebooks to the receiving device.

Example 19. The method of any of examples 13-18, further including: receiving a feedback message from the receiving device including an indication of a gap-to-capacity number of units for a next retransmission; adjusting a retransmission size by the gap-to-capacity number of units; and sending the next retransmission to the receiving device.

As used in this application, the terms "component," "module," "system," and the like are intended to include a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a wireless device and the wireless device may be referred to as a component. One or more components may reside within a process and/or thread of execution and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known network, computer, processor, and/or process related communication methodologies.

A number of different cellular and mobile communication services and standards are available or contemplated in the future, all of which may implement and benefit from the various embodiments. Such services and standards include, e.g., third generation partnership project (3GPP), long term evolution (LTE) systems, third generation wireless mobile communication technology (3G), fourth generation wireless mobile communication technology (4G), fifth generation wireless mobile communication technology (5G), global system for mobile communications (GSM), universal mobile telecommunications system (UMTS), 3GSM, general packet radio service (GPRS), code division multiple access (CDMA) systems (e.g., cdmaOne, CDMA1020™), enhanced data rates for GSM evolution (EDGE), advanced mobile phone system (AMPS), digital AMPS (IS-136/TDMA), evolution-data optimized (EV-DO), digital enhanced cordless telecommunications (DECT), Worldwide Interoperability for Microwave Access (WiMAX), wireless local area network (WLAN), Wi-Fi Protected Access I & II (WPA, WPA2), and integrated digital enhanced network (iDEN). Each of these technologies involves, for example, the transmission and reception of voice, data, signaling, and/or content messages. It should be understood that any references to terminology and/or technical details related to an individual telecommunication standard or technology are for illustrative purposes only, and are not intended to limit the scope of the claims to a particular communication system or technology unless specifically recited in the claim language.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 600, 700, 800, 900, 1000, 1100, 1200, 1300, and/or 1400 may be substituted for or combined with one or more operations of the methods 600, 700, 800, 900, 1000, 1100, 1200, 1300, and/or 1400.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, components, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of the claims.

The hardware used to implement various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

What is claimed is:

1. A method for supporting lossy compression feedback in wireless communication retransmissions performed by a processor of a receiving device, comprising:
    determining first decoding results for a number of code blocks in a first feedback group received from a sending device;
    selecting a first compression codebook from among a group of allowed codebooks indicated by the sending device for use in generating a feedback message for the first decoding results based at least in part on a probability of successful decoding of each code block in the first feedback group, wherein the selected first compression codebook provides a lowest rate of distortion of the plurality of codebooks based on the first decoding results;
    generating a first feedback message for the first decoding results using the selected first compression codebook; and
    sending the first feedback message to the sending device.

2. The method of claim 1, further comprising:
    determining second decoding results for a number of code blocks in a second feedback group received from the sending device;
    selecting a second compression codebook from among the plurality of codebooks for use in generating a feedback message for the second decoding results based at least in part on a probability of successful decoding of each code block in the second feedback group, wherein the selected second compression codebook provides a lowest rate of distortion of the plurality of codebooks based on the second decoding results;
    generating a second feedback message for the second decoding results using the selected second compression codebook; and
    sending the second feedback message to the sending device.

3. The method of claim 2, wherein the first feedback group is a first symbol received from the sending device and the second feedback group is a second symbol received from the sending device.

4. The method of claim 1, further comprising:
    determining a retransmission cycle number for each code block in the first feedback group; and
    determining the probability of successful decoding of each code block in the first feedback group based at least in part on each code block's determined retransmission cycle number.

5. The method of claim 4, wherein determining the probability of successful decoding of each code block in the first feedback group based at least in part on each code block's determined retransmission cycle number comprises determining the probability of successful decoding of each code block in the first feedback group as a probability value correlated with that code block's retransmission cycle number in a pre-defined mapping of retransmission cycle numbers to probability values.

6. The method of claim 5, further comprising:
    receiving from the sending device:
        an indication of a number of code blocks to feedback;
        an indication of a number of waveforms to be used for feedback; and
        the pre-defined mapping of retransmission cycle numbers to probability values,
    wherein selecting the first compression codebook from among the plurality of codebooks for use in generating the feedback message for the first decoding results based at least in part on the probability of successful decoding of each code block in the first feedback group comprises selecting the first compression codebook from among the plurality of codebooks for use in generating the feedback message for the first decoding results based at least in part on the probability of successful decoding of each code block in the first feedback group, the number of code blocks to feedback, and the number of waveforms to be used for feedback.

7. The method of claim 6, further comprising:
    receiving an indication of an update to the pre-defined mapping of retransmission cycle numbers to probability values from the sending device.

8. The method of claim 6, further comprising:
observing a condition of the wireless communication; and
updating probability values of the pre-defined mapping of retransmission cycle numbers to probability values based at least in part on an adaptation rule associated with the observed condition of the wireless communication.

9. The method of claim 1, wherein the first compression codebook is signaled to the receiving device by the sending device.

10. The method of claim 1, further comprising:
determining a gap-to-capacity number of units for a next retransmission; and
inserting an indication of the gap-to-capacity number of units for the next retransmission in the first feedback message.

11. The method of claim 1, wherein the first feedback message includes a feedback rank indication.

12. A wireless device, comprising:
a processor configured to:
determine first decoding results for a number of code blocks in a first feedback group received from a sending device;
select a first compression codebook from among a group of allowed codebooks indicated by the sending device for use in generating a feedback message for the first decoding results based at least in part on a probability of successful decoding of each code block in the first feedback group, wherein the selected first compression codebook provides a lowest rate of distortion of the plurality of codebooks based on the first decoding results;
generate a first feedback message for the first decoding results using the selected first compression codebook; and
send the first feedback message to the sending device.

13. The wireless device of claim 12, wherein the processor is further configured to:
determine second decoding results for a number of code blocks in a second feedback group received from the sending device;
select a second compression codebook from among the plurality of codebooks for use in generating a feedback message for the second decoding results based at least in part on a probability of successful decoding of each code block in the second feedback group, wherein the selected second compression codebook provides a lowest rate of distortion of the plurality of codebooks based on the second decoding results;
generate a second feedback message for the second decoding results using the selected second compression codebook; and
send the second feedback message to the sending device.

14. The wireless device of claim 12, wherein the processor is further configured to:
determine a retransmission cycle number for each code block in the first feedback group; and
determine the probability of successful decoding of each code block in the first feedback group based at least in part on each code block's determined retransmission cycle number.

15. The wireless device of claim 12, wherein the processor is further configured to:
determine a gap-to-capacity number of units for a next retransmission; and
insert an indication of the gap-to-capacity number of units for the next retransmission in the first feedback message.

16. The wireless device of claim 12, wherein the first feedback message includes a feedback rank indication.

17. A wireless device, comprising:
means for determining first decoding results for a number of code blocks in a first feedback group received from a sending device;
means for selecting a first compression codebook from among a group of allowed codebooks indicated by the sending device for use in generating a feedback message for the first decoding results based at least in part on a probability of successful decoding of each code block in the first feedback group, wherein the selected first compression codebook provides a lowest rate of distortion of the plurality of codebooks based on the first decoding results;
means for generating a first feedback message for the first decoding results using the selected first compression codebook; and
means for sending the first feedback message to the sending device.

18. The wireless device of claim 17, further comprising:
means for determining second decoding results for a number of code blocks in a second feedback group received from the sending device;
means for selecting a second compression codebook from among the plurality of codebooks for use in generating a feedback message for the second decoding results based at least in part on a probability of successful decoding of each code block in the second feedback group, wherein the selected second compression codebook provides a lowest rate of distortion of the plurality of codebooks based on the second decoding results;
means for generating a second feedback message for the second decoding results using the selected second compression codebook; and
means for sending the second feedback message to the sending device.

19. The wireless device of claim 17, further comprising:
means for determining a retransmission cycle number for each code block in the first feedback group; and
means for determining the probability of successful decoding of each code block in the first feedback group based at least in part on each code block's determined retransmission cycle number.

20. The wireless device of claim 17, further comprising:
means for determining a gap-to-capacity number of units for a next retransmission; and
means for inserting an indication of the gap-to-capacity number of units for the next retransmission in the first feedback message.

21. The wireless device of claim 17, wherein the first feedback message includes a feedback rank indication.

22. A non-transitory processor-readable storage medium having stored thereon processor-executable instructions to cause a processor of a wireless device to perform operations comprising:
determining first decoding results for a number of code blocks in a first feedback group received from a sending device;
selecting a first compression codebook from among a group of allowed codebooks indicated by the sending device for use in generating a feedback message for the first decoding results based at least in part on a probability of successful decoding of each code block in the first feedback group, wherein the selected first compression codebook provides a lowest rate of distortion of the plurality of codebooks based on the first decoding results;

generating a first feedback message for the first decoding results using the selected first compression codebook; and sending the first feedback message to the sending device.

23. The non-transitory processor-readable storage medium of claim 22, wherein the stored processor-executable instructions are configured to cause the processor of the wireless device to perform operations further comprising:

determining second decoding results for a number of code blocks in a second feedback group received from the sending device;

selecting a second compression codebook from among the plurality of codebooks for use in generating a feedback message for the second decoding results based at least in part on a probability of successful decoding of each code block in the second feedback group, wherein the selected second compression codebook provides a lowest rate of distortion of the plurality of codebooks based on the second decoding results;

generating a second feedback message for the second decoding results using the selected second compression codebook; and sending the second feedback message to the sending device.

24. The non-transitory processor-readable storage medium of claim 22, wherein the stored processor-executable instructions are configured to cause the processor of the wireless device to perform operations further comprising:

determining a retransmission cycle number for each code block in the first feedback group; and determining the probability of successful decoding of each code block in the first feedback group based at least in part on each code block's determined retransmission cycle number.

25. The non-transitory processor-readable storage medium of claim 22, wherein the stored processor-executable instructions are configured to cause the processor of the wireless device to perform operations further comprising:

determining a gap-to-capacity number of units for a next retransmission; and inserting an indication of the gap-to-capacity number of units for the next retransmission in the first feedback message.

26. The non-transitory processor-readable storage medium of claim 22, wherein the stored processor-executable instructions are configured to cause the processor of the wireless device to perform operations such that the first feedback message includes a feedback rank indication.

* * * * *